(12) United States Patent
Ju et al.

(10) Patent No.: US 12,100,770 B2
(45) Date of Patent: Sep. 24, 2024

(54) FIELD EFFECT TRANSISTOR WITH GATE ISOLATION STRUCTURE AND METHOD

(71) Applicant: Taiwan Semiconductor Manufacturing Co., Ltd., Hsinchu (TW)

(72) Inventors: Shi-Ning Ju, Hsinchu (TW);
Kuo-Cheng Chiang, Hsinchu (TW);
Chih-Hao Wang, Hsinchu (TW);
Kuan-Lun Cheng, Hsinchu (TW);
Guan-Lin Chen, Hsinchu (TW);
Kuan-Ting Pan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 425 days.

(21) Appl. No.: 17/379,936

(22) Filed: Jul. 19, 2021

(65) Prior Publication Data
US 2023/0014998 A1    Jan. 19, 2023

(51) Int. Cl.
*H01L 29/786* (2006.01)
*H01L 21/8234* (2006.01)
(Continued)

(52) U.S. Cl.
CPC ............... *H01L 29/78696* (2013.01); *H01L 21/823418* (2013.01); *H01L 21/823481* (2013.01);
(Continued)

(58) Field of Classification Search
CPC ....... H01L 29/78696; H01L 21/823418; H01L 21/823481; H01L 29/0653; H01L 29/0665; H01L 29/42392; H01L 29/66742; H01L 21/28185; H01L 27/092; H01L 29/165; H01L 29/513; H01L 29/518; H01L 29/7848; H01L 21/823475; H01L 29/0673; H01L 29/0847; H01L 29/66439; H01L 29/66545; H01L 21/823412; H01L 21/823437; H01L 21/82345; H01L 27/088;
(Continued)

(56) References Cited

U.S. PATENT DOCUMENTS 9,236,267 B2    1/2016 De et al.
9,502,265 B1   11/2016 Jiang et al.
(Continued)

*Primary Examiner* — Tong-Ho Kim
(74) *Attorney, Agent, or Firm* — Seed IP Law Group LLP

(57) ABSTRACT

A device includes a substrate, a first semiconductor channel over the substrate, a second semiconductor channel over the substrate and laterally offset from the first semiconductor channel, and a third semiconductor channel over the substrate and laterally offset from the second semiconductor channel. A first gate structure, a second gate structure, and a third gate structure are over and lateral surround the first, second, and third semiconductor channels, respectively. A first inactive fin is between the first gate structure and the second gate structure, and a second inactive fin is between the second gate structure and the third gate structure. A bridge conductor layer is over the first, second, and third gate structures, and the first and second inactive fins. A dielectric plug extends from an upper surface of the second inactive fin, through the bridge conductor layer, to at least an upper surface of the bridge conductor layer.

20 Claims, 39 Drawing Sheets

(51) Int. Cl.
*H01L 29/06* (2006.01)
*H01L 29/423* (2006.01)
*H01L 29/66* (2006.01)

(52) U.S. Cl.
CPC ...... *H01L 29/0653* (2013.01); *H01L 29/0665* (2013.01); *H01L 29/42392* (2013.01); *H01L 29/66742* (2013.01)

(58) Field of Classification Search
CPC .......... H01L 29/775; H01L 21/823431; H01L 27/0886; B82Y 10/00
USPC ...................................................... 257/288
See application file for complete search history.

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 10,840,146 B1 * | 11/2020 | Paul ................. H01L 29/66553 |
| 2022/0254776 A1 * | 8/2022 | Cheng ............... H01L 29/66742 |

* cited by examiner

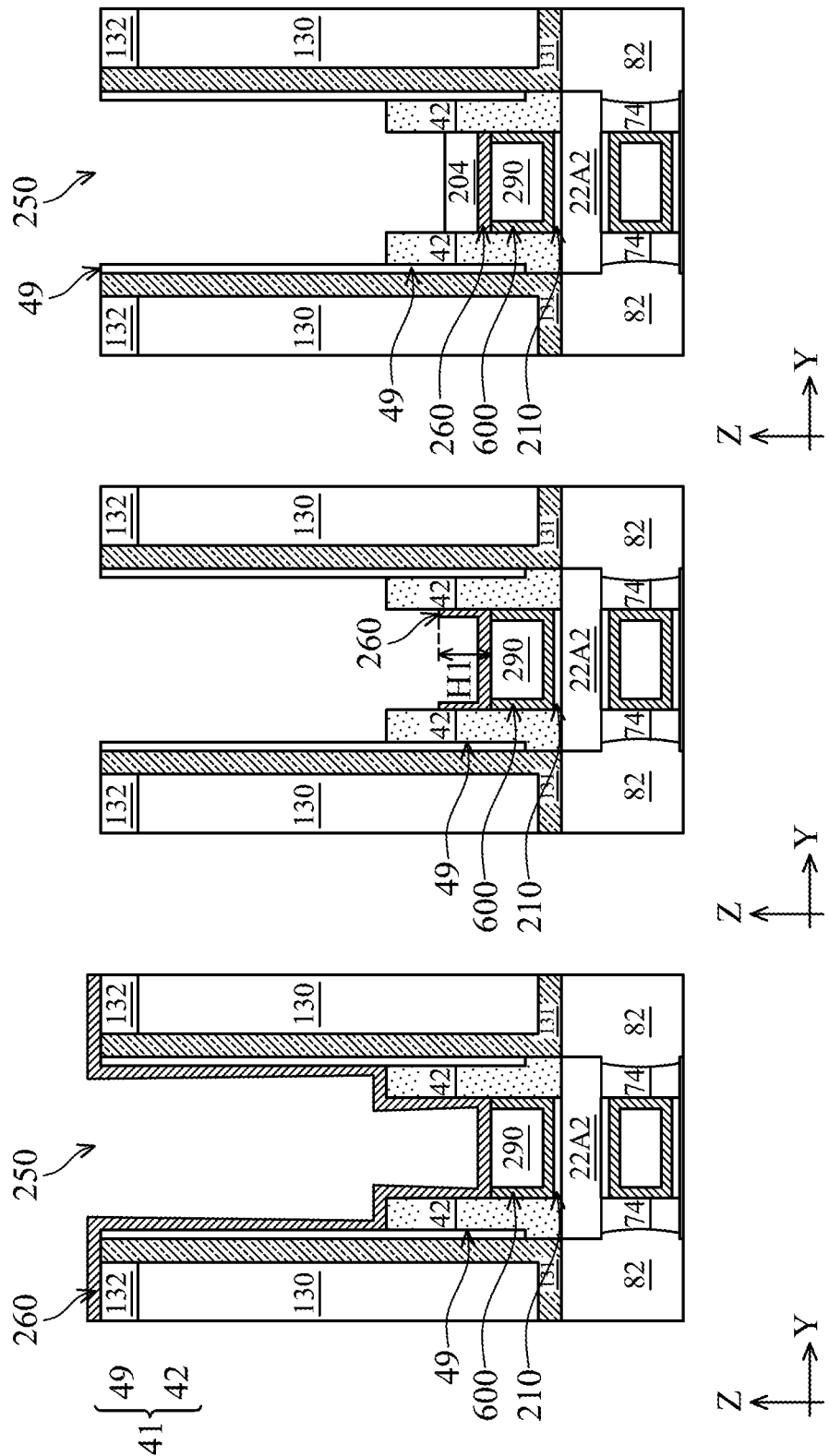

FIELD EFFECT TRANSISTOR WITH GATE ISOLATION STRUCTURE AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-28 are views of various embodiments of an IC device of at various stages of fabrication according to various aspects of the present disclosure.

DETAILED DESCRIPTION

Figure 1A:
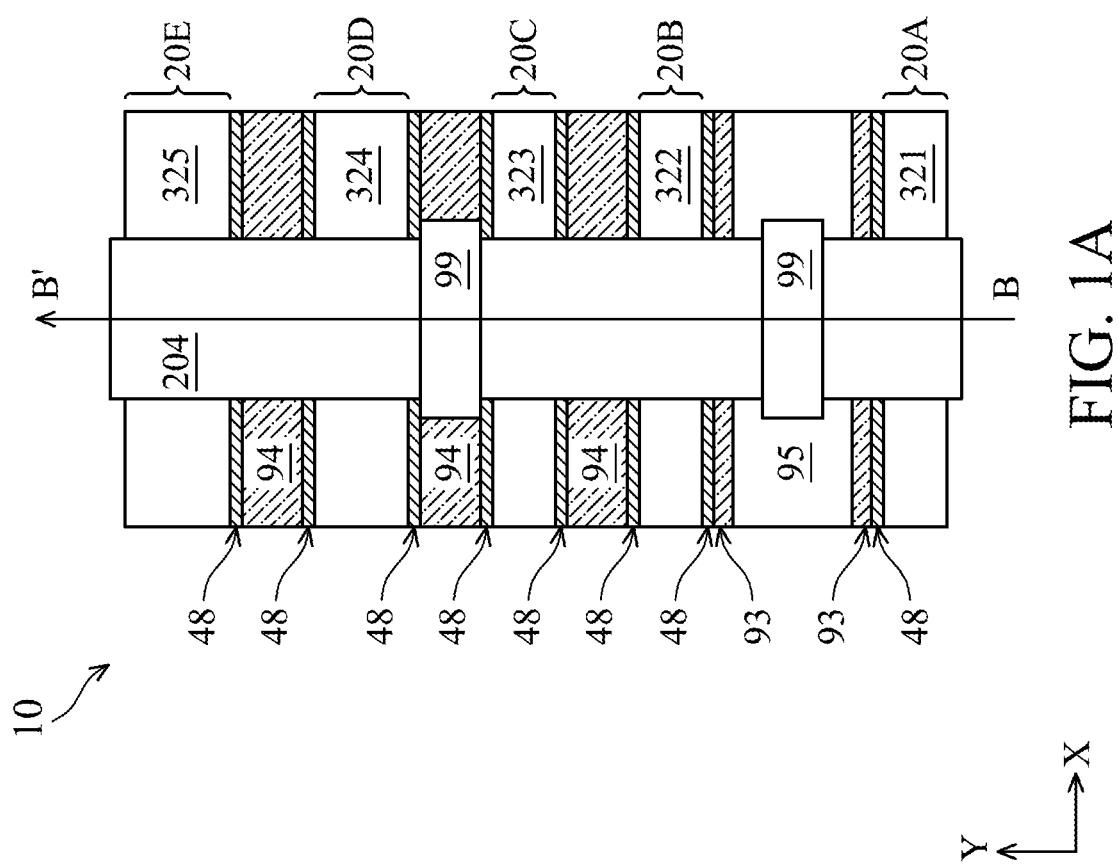
FIGS. 1A-1H are diagrammatic top and cross-sectional side views of a portion of an IC device fabricated according to embodiments of the present disclosure.
Figure 1B:
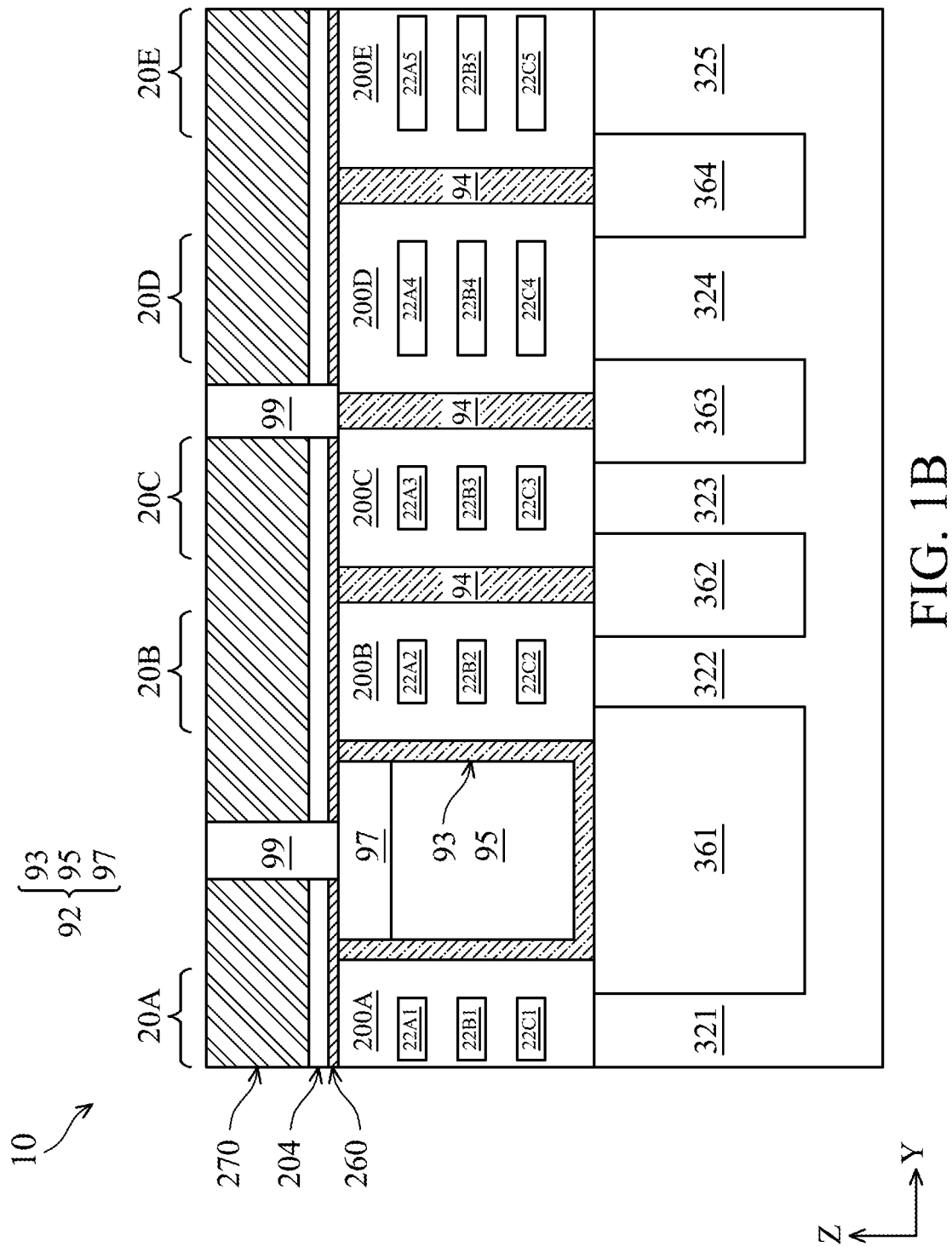

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms. Generally, the term "substantially" indicates a tighter tolerance than the term "about." For example, a thickness of "about 100 units" will include a larger range of values, e.g., 70 units to 130 units (+/−30%), than a thickness of "substantially 100 units," which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that "about" as a relative term is not as stringent as "substantially" when used in a similar context.

The present disclosure is generally related to semiconductor devices, and more particularly to field-effect transistors (FETs), such as planar FETs, three-dimensional fin-line FETs (FinFETs), or gate-all-around (GAA) devices. In advanced technology nodes, cell height scaling can be constrained by layout restrictions on spacing between gate isolation ("cut metal gate") structures and neighboring semiconductor fins related to overlap and critical dimension. Gate isolation structures disclosed herein improve spacing constraints by employing a self-aligned fabrication process.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A-1H illustrate diagrammatic top and cross-sectional side views of a portion of an IC device 10 fabricated according to embodiments of the present disclosure, where the IC device 10 includes gate-all-around (GAA) devices 20A-20E. FIGS. 1A, 1C, 1E, 1G are diagrammatic top views of the portion of the IC device 10 including the GAA devices 20A-20E. Certain features are removed from view intentionally in the top views of FIGS. 1A, 1C, 1E, 1G for simplicity of illustration. The GAA devices 20A-20E may include at least an N-type FET (NFET) or a P-type FET (PFET) in some embodiments. Integrated circuit devices such as the IC device IO frequently include transistors having different threshold voltages based on their function in the IC device. For example, input/output (IO) transistors typically have the highest threshold voltages, core logic transistors typically have the lowest threshold voltages, and a third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages.

The GAA devices 20A-20E are formed over and/or in a substrate 110, and generally include gate structures 200A-200E straddling semiconductor channels, alternately referred to as "nanostructures," located over semiconductor fins 321-325 protruding from, and separated by, isolation structures 361-364. The channels are labeled "22AX" to "22CX," where "X" is an integer from 1 to 5, corresponding to the five transistors 20A-20E, respectively. Each gate structure 200A-200E controls current flow through the channels 22A1-22C5.

In many IC devices, it is preferable for the gate structures of two or more neighboring GAA devices to be electrically connected. In a typical process, material layers of gate structures are formed over a large number of adjacent semiconductor fins, and isolation structures formed before or after the material layers are used to "cut" the material layers to isolate certain portions of the material layers from other portions. Each portion of the material layers may be one or more gate structures corresponding to one or more GAA devices. For illustrative purposes, in the configuration shown in FIGS. 1A-1H, two gate isolation structures 99 isolate the five gate structures 200A-200E, such that the gate structures 200B, 200C are electrically connected, the gate structures 200D, 200E are electrically connected, and the gate structure 200A, the gate structures 200B-200C, and the gate structures 200D-200E are electrically isolated from each other. The gate isolation structures 99 are alternatively referred to as "dielectric plugs 99." The electrical connection is achieved by a bridge conductor layer 204, which overlies the gate structures 200A-200E. The gate isolation structures 99 extend through the bridge conductor layer 204, as well as a dielectric capping layer 270 and an adhesive layer 260, which also overlie the gate structures 200A-200E. The gate isolation structures 99 further contact inactive fin structures 94 or inactive fin cap 97 of inactive block 92. The inactive fin structures 94 and the inactive block 92 extend from the top surface of the gate structures 200A-200E to the isolation structures 361-364, such that the gate structures 200A-200E may be isolated laterally from each other, e.g., the gate structure 200B and the gate structure 200C are laterally isolated by one of the inactive fin structures 94. In some embodiments, the inactive fin structures 94 extend about 5 nm to about 25 nm above the upper surface of the channels 22A1, 22A2, 22A3, 22A4, 22A5.

In the various embodiments of the disclosure, the inactive fin structures 94 are formed in a self-aligned process prior to formation of the gate structures 200A-200E, and the gate isolation structures 99 are formed in another self-aligned process following formation of the gate structures 200A-200E. As such, physical separation between adjacent GAA devices, such as the GAA devices 200B, 200C can be shrunk by at least 5% compared to other gate isolation processes. Further description of the inactive fin structures 94 and the inactive block 92 is provided with respect to FIGS. 1E-1H below.

Figure 1D:
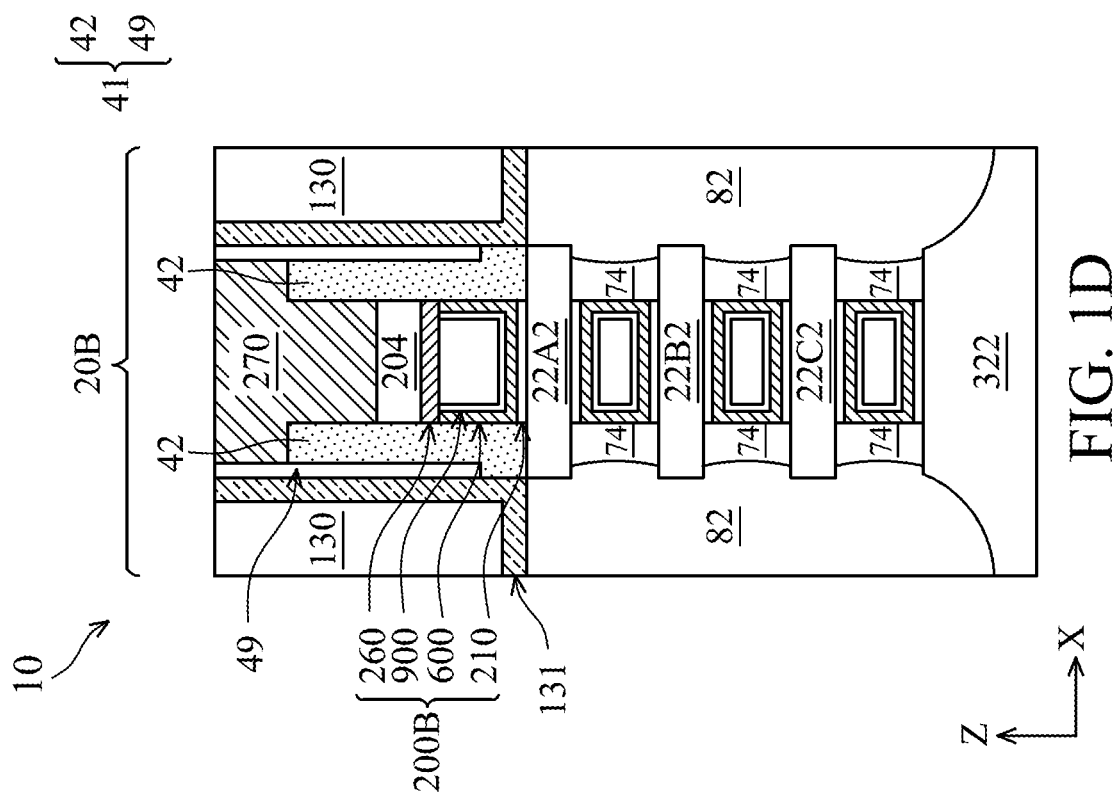
Figure 1C:
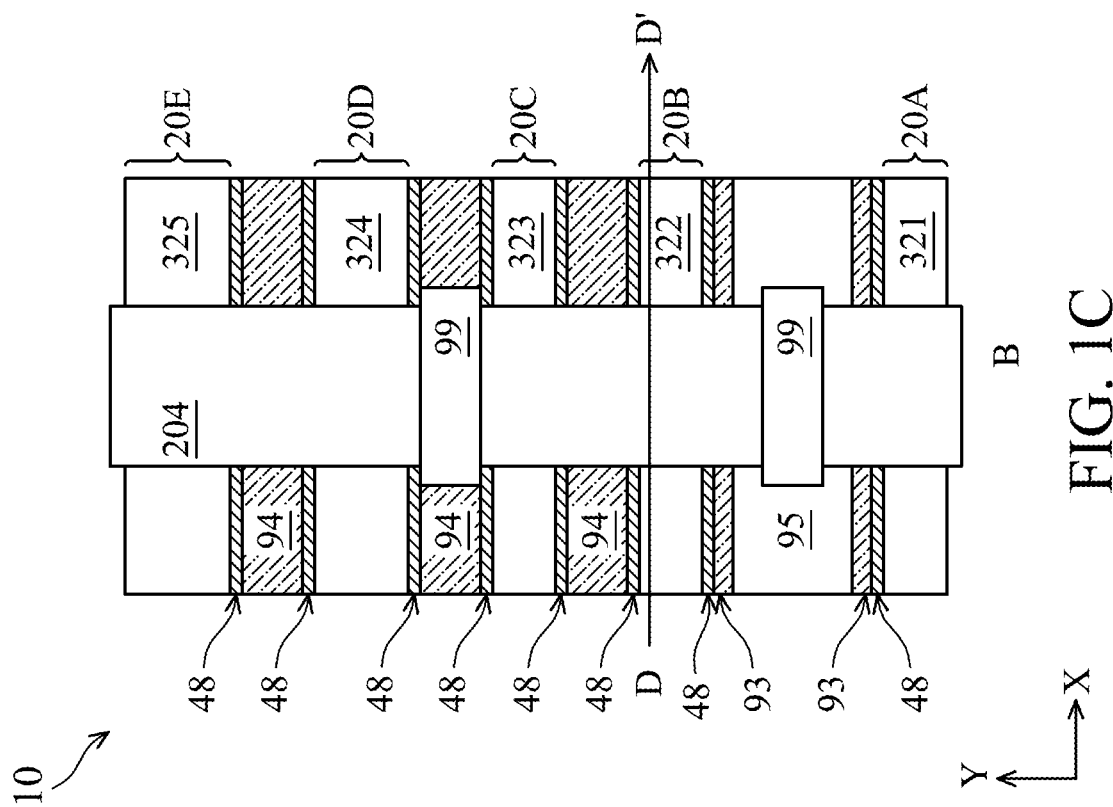

Referring to FIGS. 1C and 1D, the cross-sectional view of the IC device 10 in FIG. 1D is taken along an X-Z plane, where the X-direction is the horizontal direction, and the Z-direction is the vertical direction. The cross-sectional view in FIG. 1D shows a single GAA device 20B of the GAA devices 20A-20E for simplicity of illustration, and the related description is generally applicable to the other GAA devices 20A, 20C-20E. The channels 22A2-22C2 are laterally abutted by source/drain features 82, and covered and surrounded by the gate structure 200B. The gate structure 200B controls flow of electrical current through the channels 22A2-22C2 to and from the source/drain features 82 based on voltages applied at the gate structure 200B and at the source/drain features 82.

In some embodiments, the fin structure 322 includes silicon. In some embodiments, the GAA device 20B is an NFET, and the source/drain features 82 thereof include silicon phosphorous (SiP). In some embodiments, the GAA device 20B is a PFET, and the source/drain features 82 thereof include silicon germanium (SiGe).

The channels 22A2-22C2 each include a semiconductive material, for example silicon or a silicon compound, such as silicon germanium, or the like. The channels 22A2-22C2 are nanostructures (e.g., having sizes that are in a range of a few nanometers) and may also each have an elongated shape and extend in the X-direction. In some embodiments, the channels 22A2-22C2 each have a nano-wire (NW) shape, a nano-sheet (NS) shape, a nano-tube (NT) shape, or other suitable nanoscale shape. The cross-sectional profile of the channels 22A2-22C2 may be rectangular, round, square, circular, elliptical, hexagonal, or combinations thereof.

In some embodiments, the lengths (e.g., measured in the X-direction) of the channels 22A2-22C2 may be different from each other, for example due to tapering during a fin etching process. In some embodiments, length of the channel 22A1 may be less than a length of the channel 22B1, which may be less than a length of the channel 22C1. The channels 22A2-22C2 each may not have uniform thickness, for example due to a channel trimming process used to expand spacing (e.g., measured in the Z-direction) between the channels 22A2-22C2 to increase gate structure fabrication process window. For example, a middle portion of each of the channels 22A2-22C2 may be thinner than the two ends of each of the channels 22A2-22C2. Such shape may be collectively referred to as a "dog-bone" shape.

In some embodiments, the spacing between the channels 22A2-22C2 (e.g., between the channel 22B2 and the channel 22A2 or the channel 22C2) is in a range between about 8 nanometers (nm) and about 12 nm. In some embodiments, a thickness (e.g., measured in the Z-direction) of each of the channels 22A2-22C2 is in a range between about 5 nm and about 8 nm. In some embodiments, a width (e.g., measured in the Y-direction, not shown in FIG. 1D, orthogonal to the X-Z plane) of each of the channels 22A2-22C2 is at least about 8 nm.

The gate structure 200B is disposed over and between the channels 22A2-22C2, respectively. In some embodiments, the gate structure 200B is disposed over and between the channels 22A2-22C2, which are silicon channels for N-type devices or silicon germanium channels for P-type devices. In some embodiments, the gate structure 200B includes an interfacial layer (IL) 210, one or more gate dielectric layers 600, one or more work function tuning layers 900, and a metal fill layer 290.

The interfacial layer 210, which may be an oxide of the material of the channels 22A2-22C2, is formed on exposed areas of the channels 22A2-22C2 and the top surface of the fin 322. The interfacial layer 210 promotes adhesion of the gate dielectric layers 600 to the channels 22A2-22C2. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfSiO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

In some embodiments, the gate structure 200B further includes one or more work function metal layers, represented collectively as work function metal layer 900. When configured as an NFET, the work function metal layer 900 of the GAA device 20B may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200B also includes metal fill layer 290. The metal fill layer 290 may include a conductive material such as tungsten, cobalt, ruthenium, iridium, molybdenum, copper, aluminum, or combinations thereof. Between the channels 22A2-22C2, the metal fill layer 290 are circumferentially surrounded (in the cross-sectional view) by the one or more work function metal layers 900, which are then circumferentially surrounded by the gate dielectric layers 600. The gate structure 200B may also include a glue layer that is formed between the one or more work function layers 900 and the metal fill layer 290 to increase adhesion. The glue layer is not specifically illustrated in FIGS. 1A-1H for simplicity.

The GAA devices 20A-20E also include gate spacers 41 and inner spacers 74 that are disposed on sidewalls of the gate dielectric layer 600 and the IL 210. The inner spacers 74 are also disposed between the channels 22A2-22C2. The gate spacers 41 and the inner spacers 74 may include a dielectric material, for example a low-k material such as SiOCN, SiON, SiN, or SiOC.

The GAA devices 20A-20E may further include source/drain contacts 120 (shown in FIGS. 1F and 1H) that are formed over the source/drain features 82. The source/drain contacts 120 may include a conductive material such as tungsten, cobalt, ruthenium, iridium, molybdenum, copper, aluminum, or combinations thereof. The source/drain contacts 120 may be surrounded by barrier layers (not shown), such as SiN or TiN, which help prevent or reduce diffusion of materials from and into the source/drain contacts 120. A silicide layer may also be formed between the source/drain features 82 and the source/drain contacts 120, so as to reduce the source/drain contact resistance. The silicide layer may contain a metal silicide material, such as cobalt silicide in some embodiments, or TiSi in some other embodiments.

The GAA devices 20A-20E further include an interlayer dielectric (ILD) 130. The ILD 130 provides electrical isolation between the various components of the GAA devices 20A-20E discussed above, for example between the gate structure 200B and the source/drain contacts 120. An etch stop layer 131 may be formed prior to forming the ILD 130, and may be positioned laterally between the ILD 130 and the gate spacers 41 and vertically between the ILD 130 and the source/drain features 82.

Figure 1E:
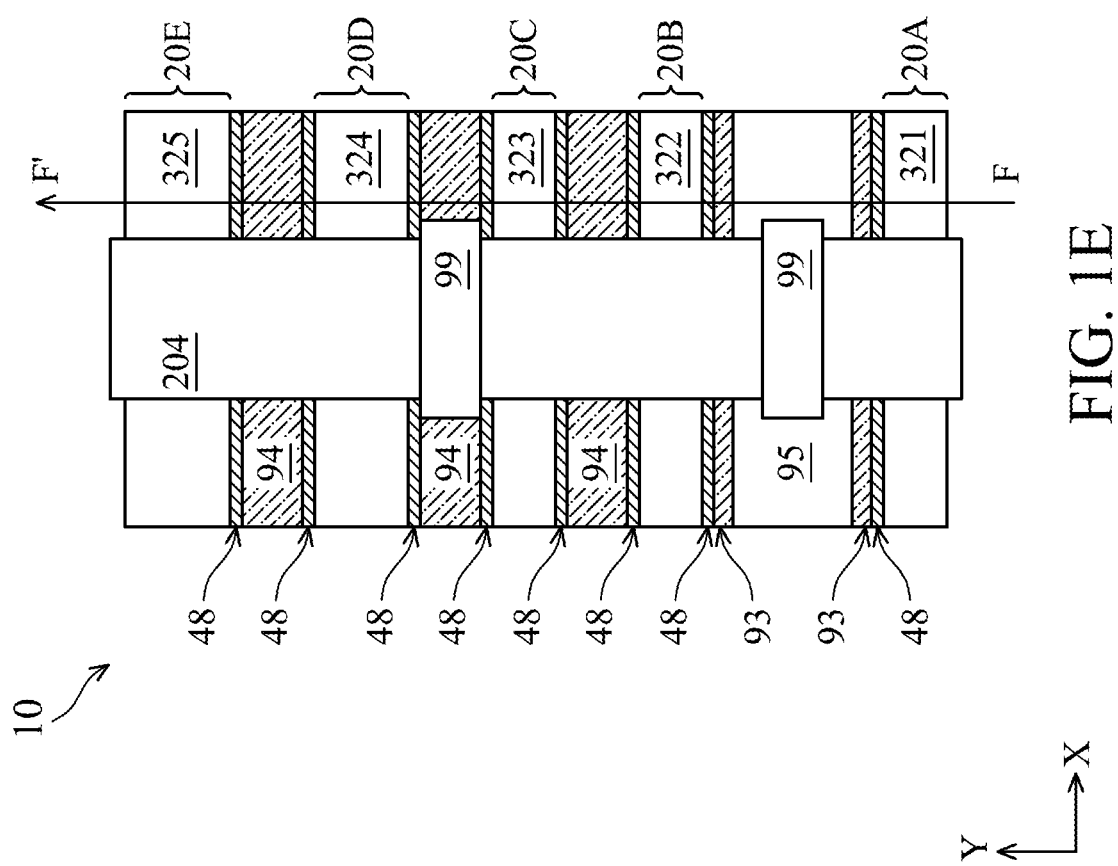
Figure 1F:
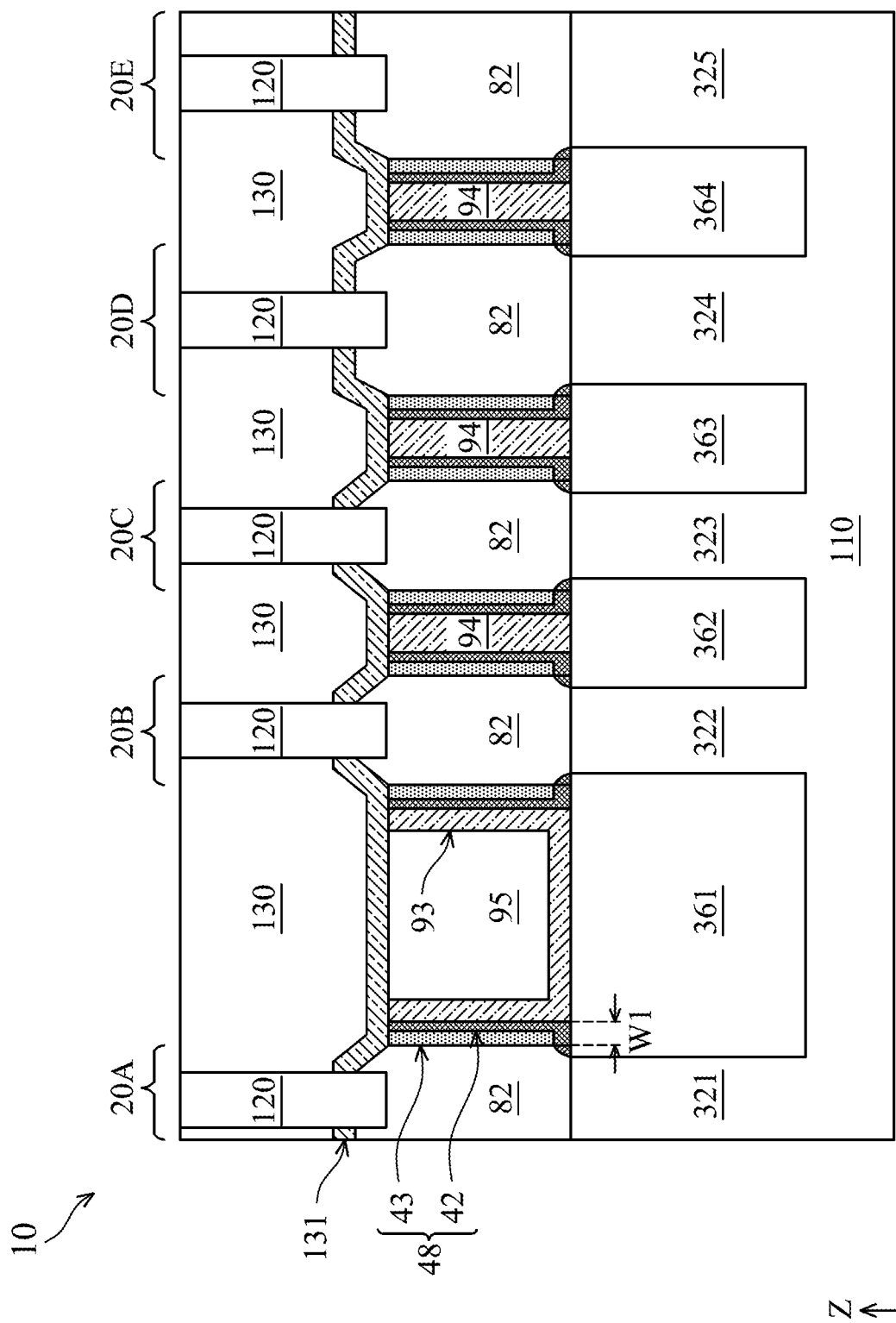
Figure 1G:
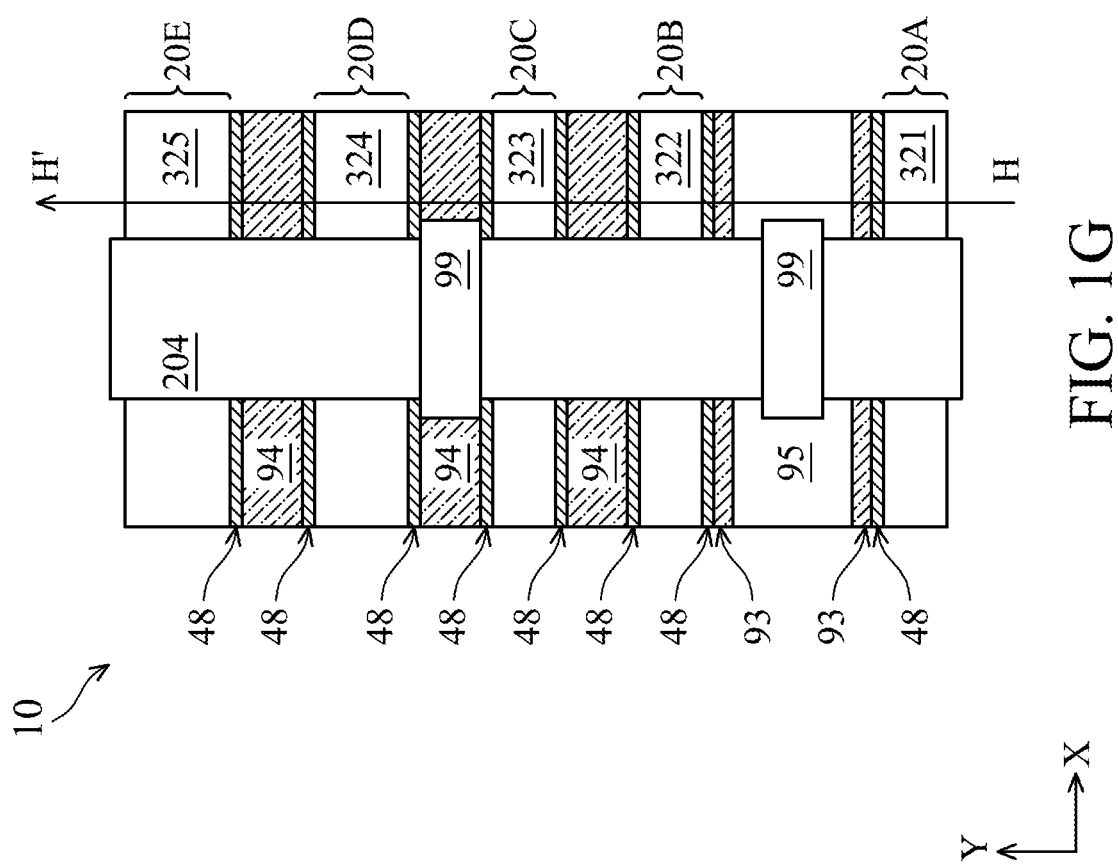
Figure 1H:
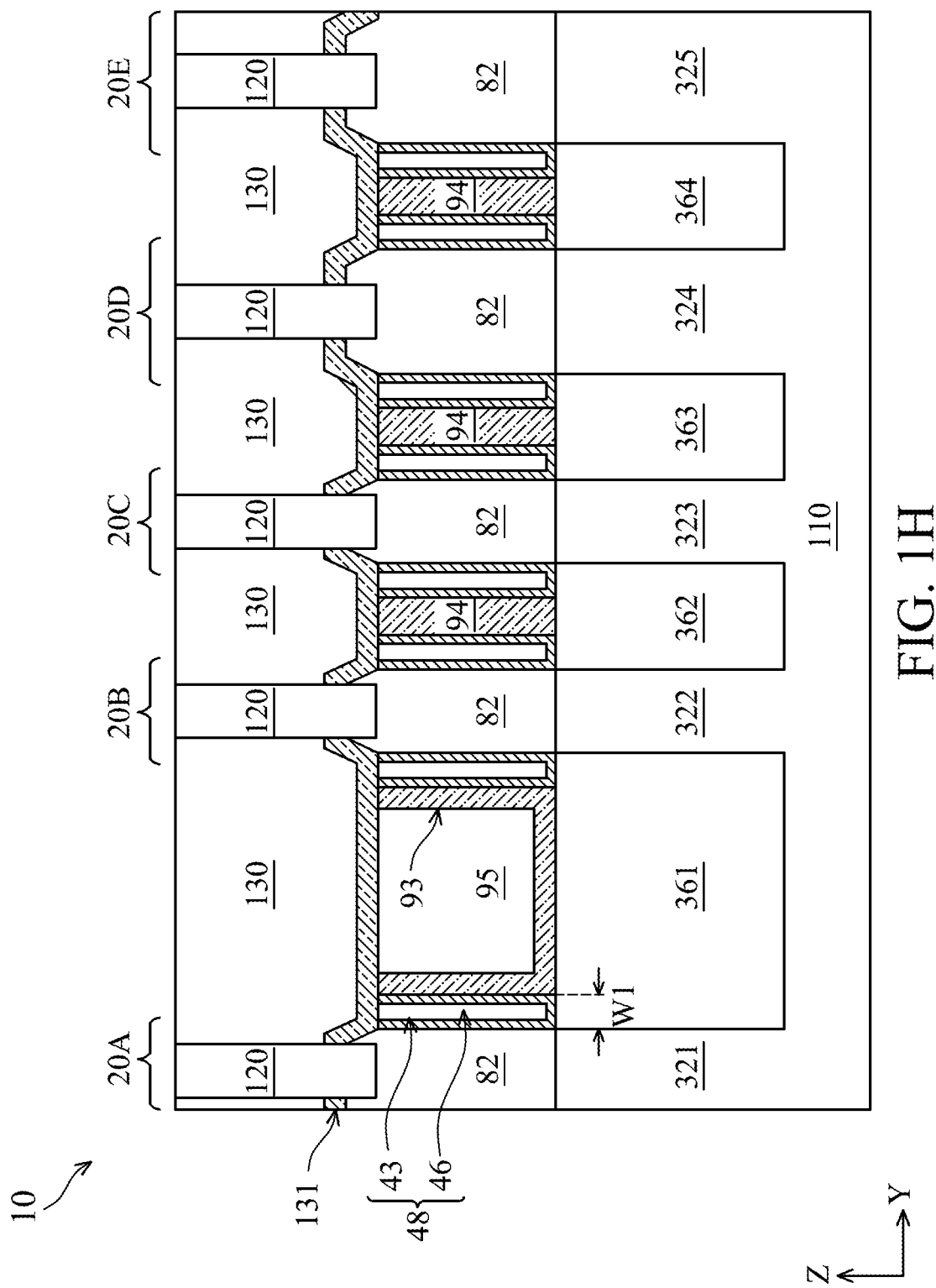

FIGS. 1F and 1H are cross-sectional views along the lines F-F' and H-H' shown in FIGS. 1E and 1G, respectively. The cross-sectional views shown in FIGS. 1F and 1H are orthogonal to the semiconductor fins 321-325 and parallel to the gate structures 200A-200E, cutting at the source/drain features 82. Dielectric isolation features 48 abut the inactive fins 94 and the inactive block 92. In some embodiments, as shown in FIG. 1F, each dielectric isolation feature 48 includes a first dielectric layer 42 and a liner dielectric layer 43. In some embodiments, the first dielectric layer 42 is or comprises polysilicon or a low-k dielectric layer comprising, SiN, SiCN, SiOCN, SiOC, or the like. In some embodiments, the liner dielectric layer 43 is a high-k dielectric layer comprising HfO2, ZrO2, HfAlOx, HfSiOx, Al$_2$O$_3$, or the like. In some embodiments, the inactive fins 94 also comprise a low-k dielectric material, such as SiN, SiCN, SiOCN, SiOC, or the like. In some embodiments, width W1 of each dielectric isolation feature 48 is in a range of about 2 nm to about 13 nm.

Figure 11:
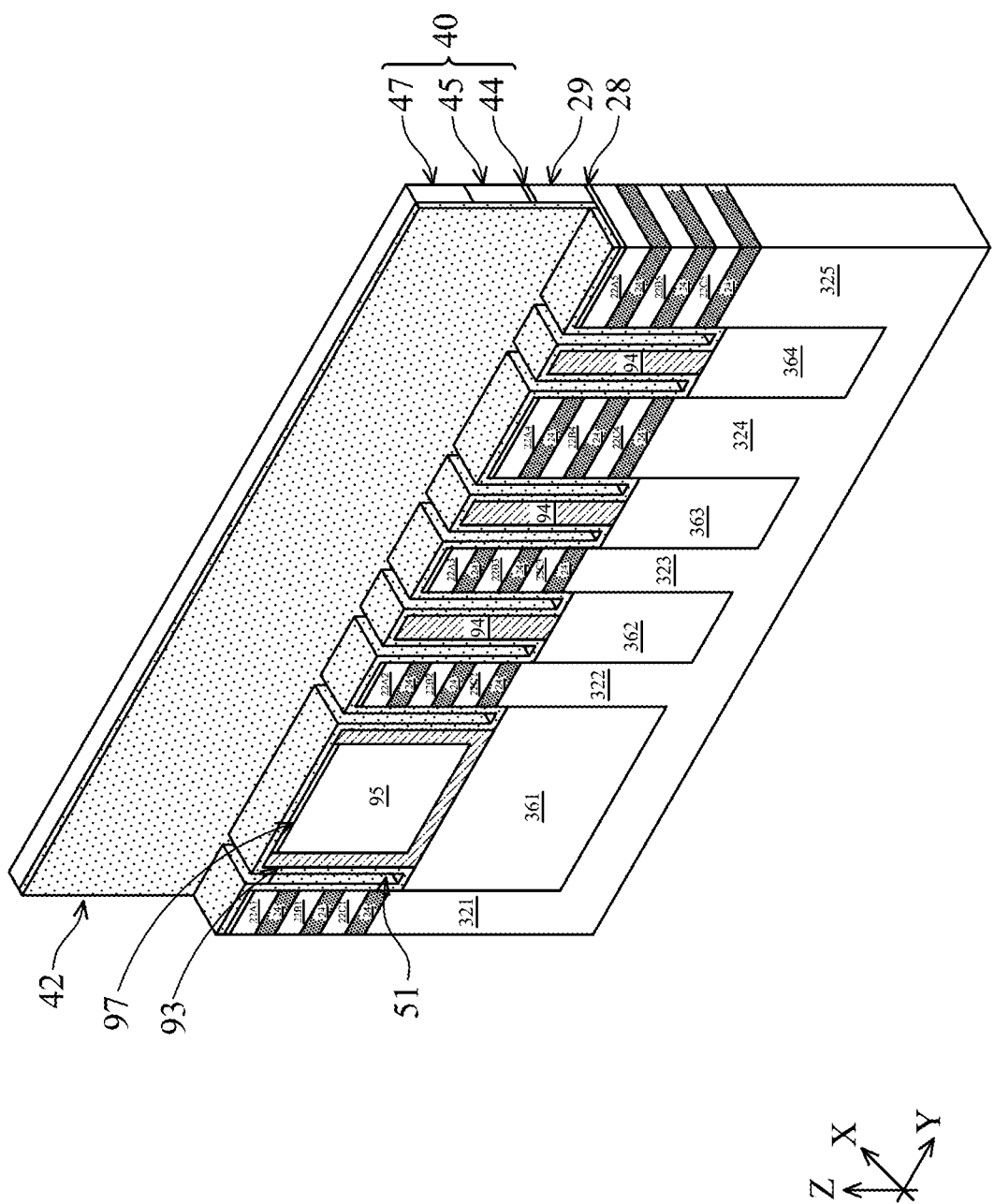
Figure 12:
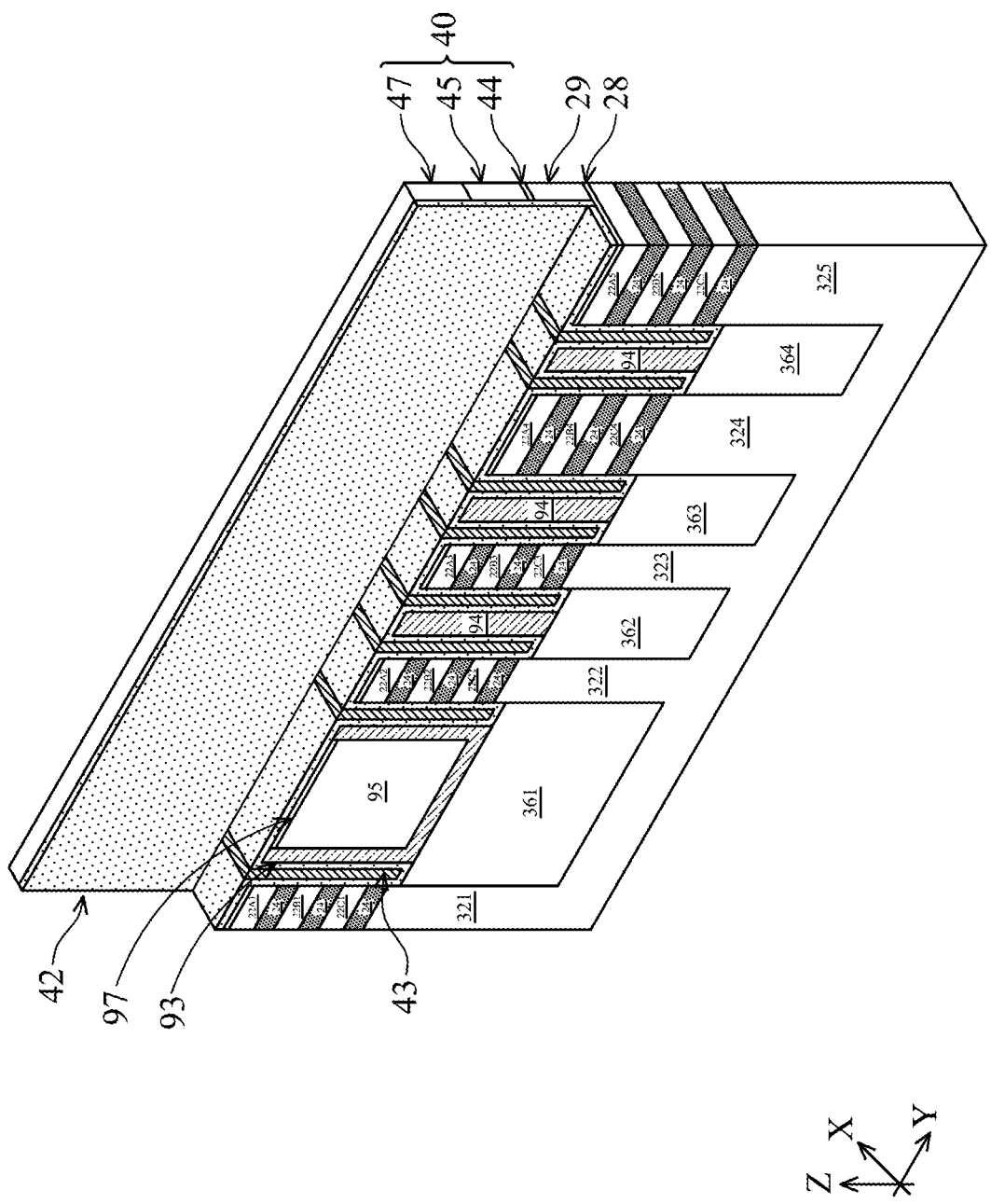
Figure 13:
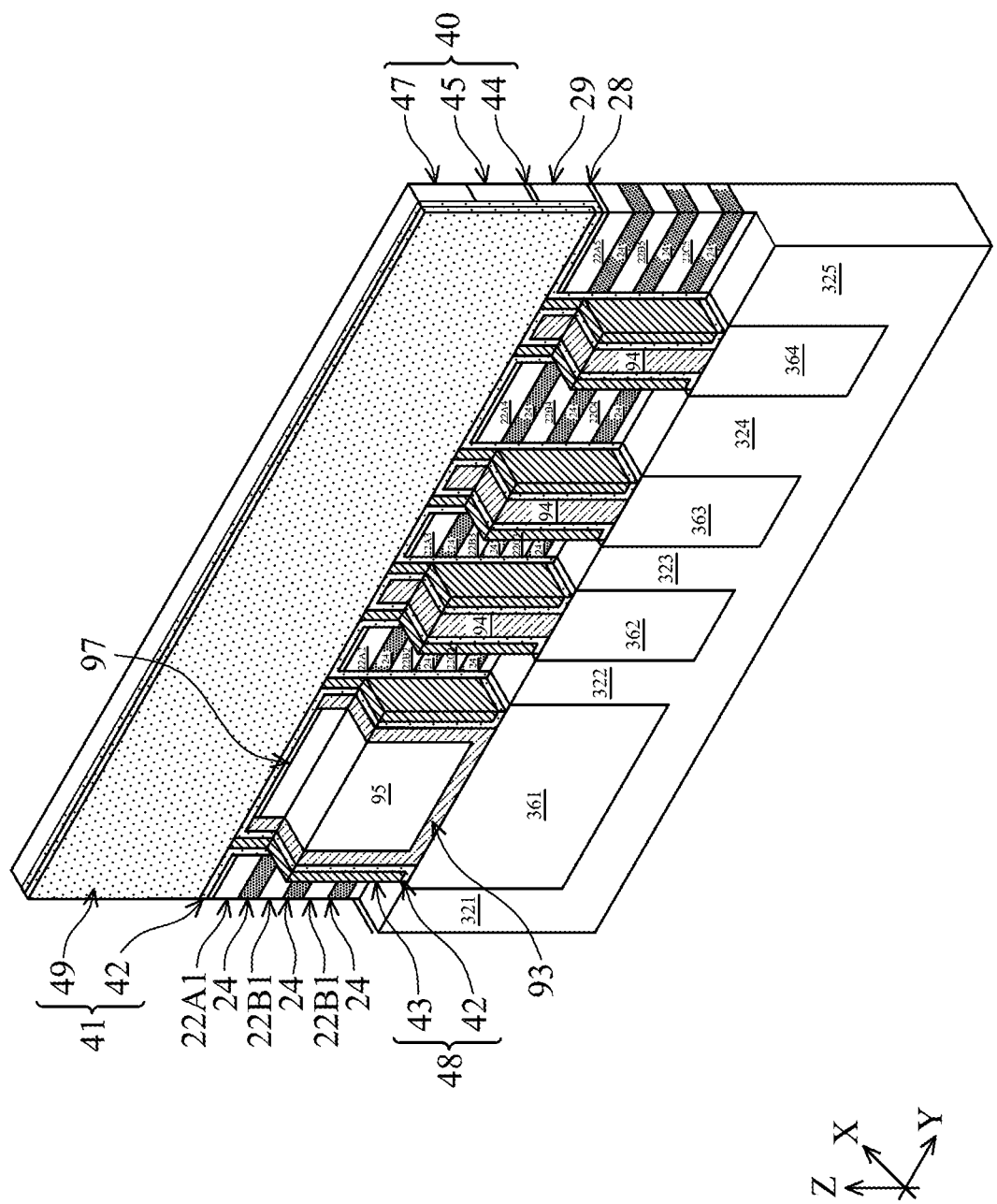

In some embodiments, as shown in FIG. 1H, each dielectric isolation feature 48 includes the liner dielectric layer 43 and a fill dielectric layer 46. In some embodiments, the liner dielectric layer 43 is a high-k dielectric layer comprising HfO2, ZrO2, HfAlOx, HfSiOx, Al$_2$O$_3$, or the like. In some embodiments, the fill dielectric layer 46 is a low-k dielectric layer comprising SiN, SiCN, SiOCN, SiOC, or the like. Generally, both configurations (FIG. 1F, FIG. 1H) include the liner dielectric layer 43, which is a high-k dielectric layer, for structural stability and enhanced diffusion resistance. To reduce parasitic capacitance, however, the dielectric isolation features 48 further include the first or third dielectric layers 42, 46, which are low-k dielectric layers. Differences in relative shape and position of the high-k and low-k dielectric layers between the two configurations shown are due to different processes for fabricating the GAA devices 20A-20E shown in FIGS. 2-22C, and FIGS. 24A-27. Specifically, FIGS. 11-13 show process operations related to formation of the dielectric isolation feature 48 of FIG. 1F, and FIGS. 24A-25 show process operations related to formation of the dielectric isolation feature 48 of FIG. 1H.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

Figure 28:
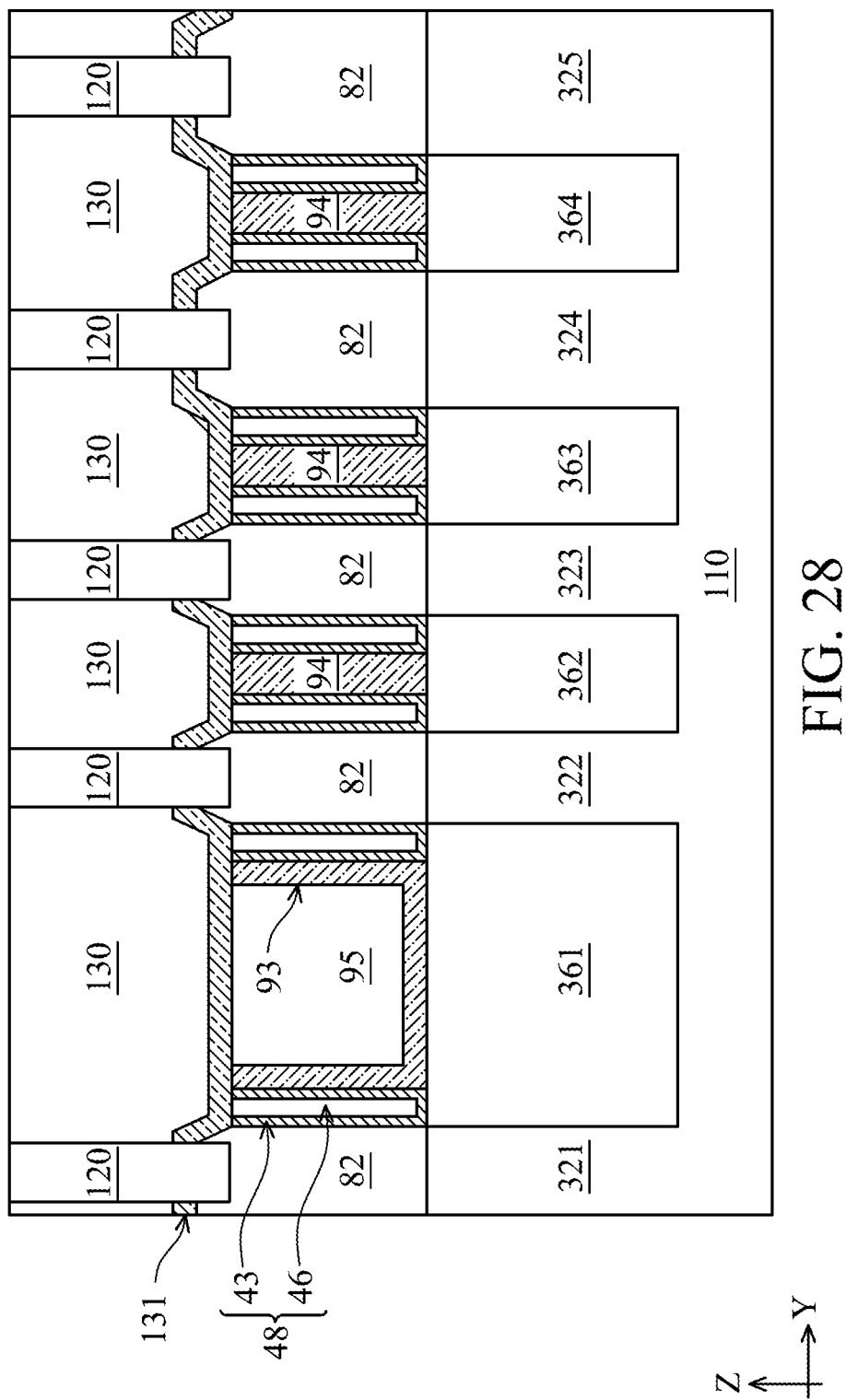
Figure 29:
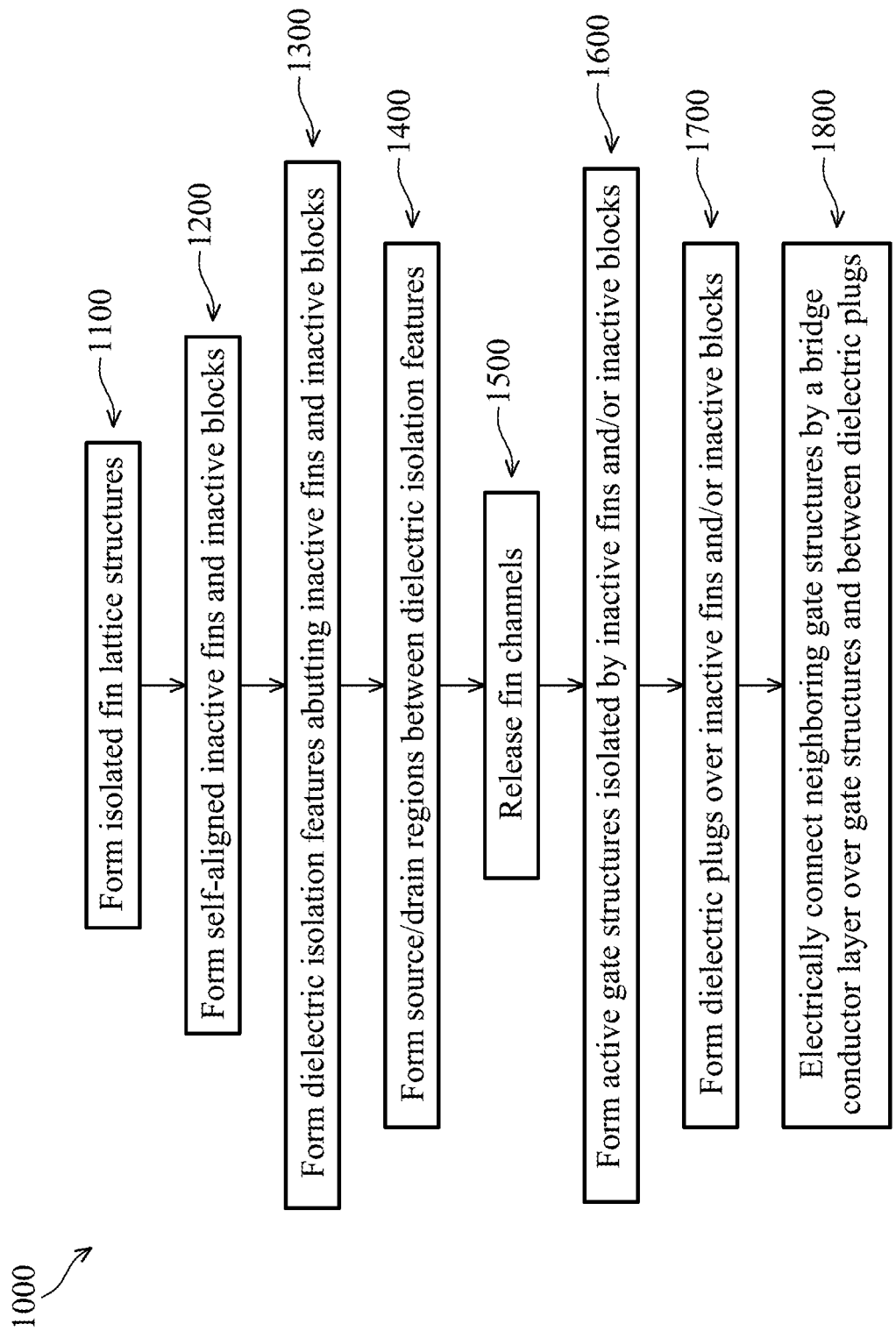
FIG. 29 is a flowchart illustrating a method of fabricating a semiconductor device according to various aspects of the present disclosure.

FIG. 29 illustrates a flowchart of a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 2-28, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

Figure 2:
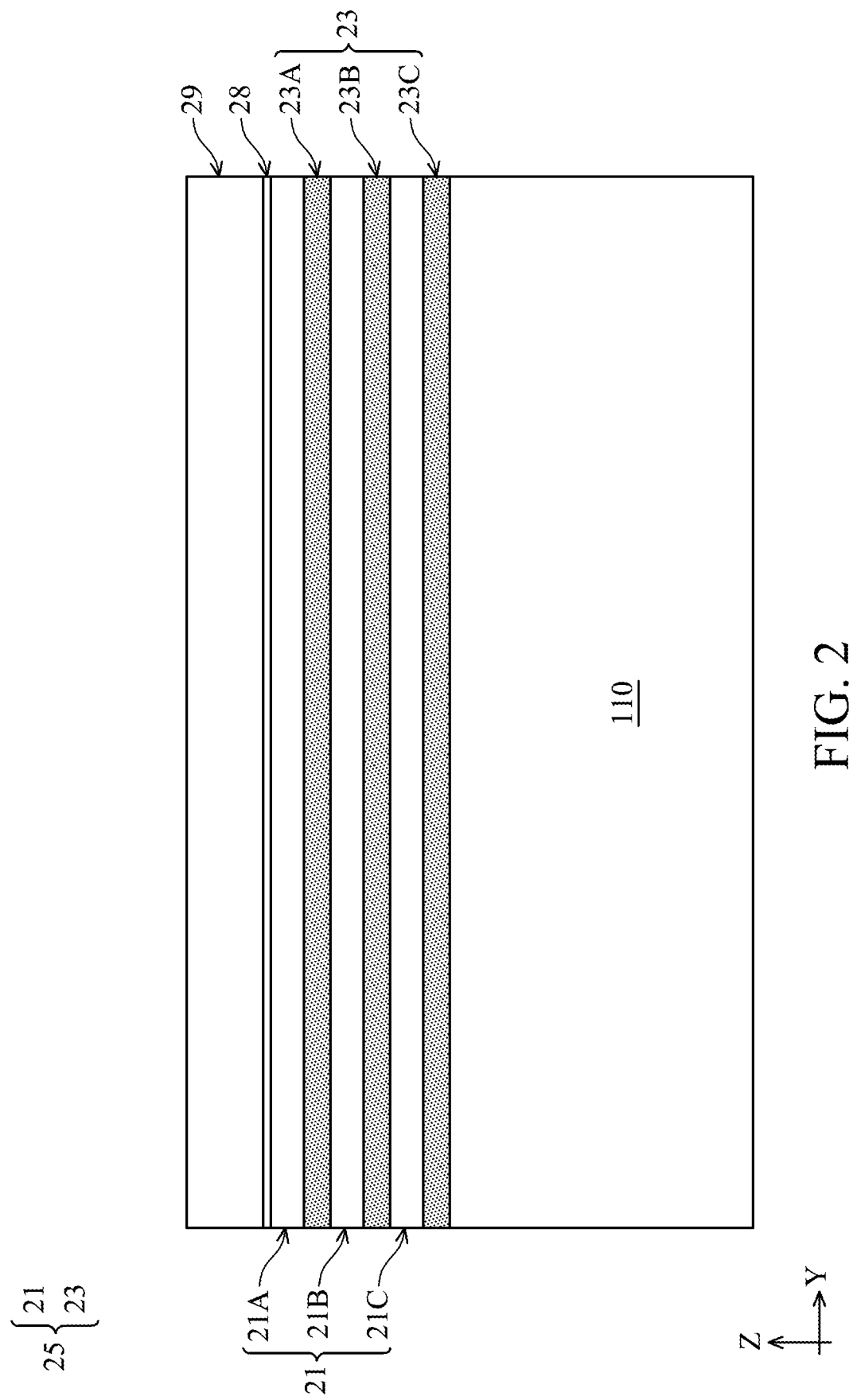

In FIG. 2, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Figure 3:
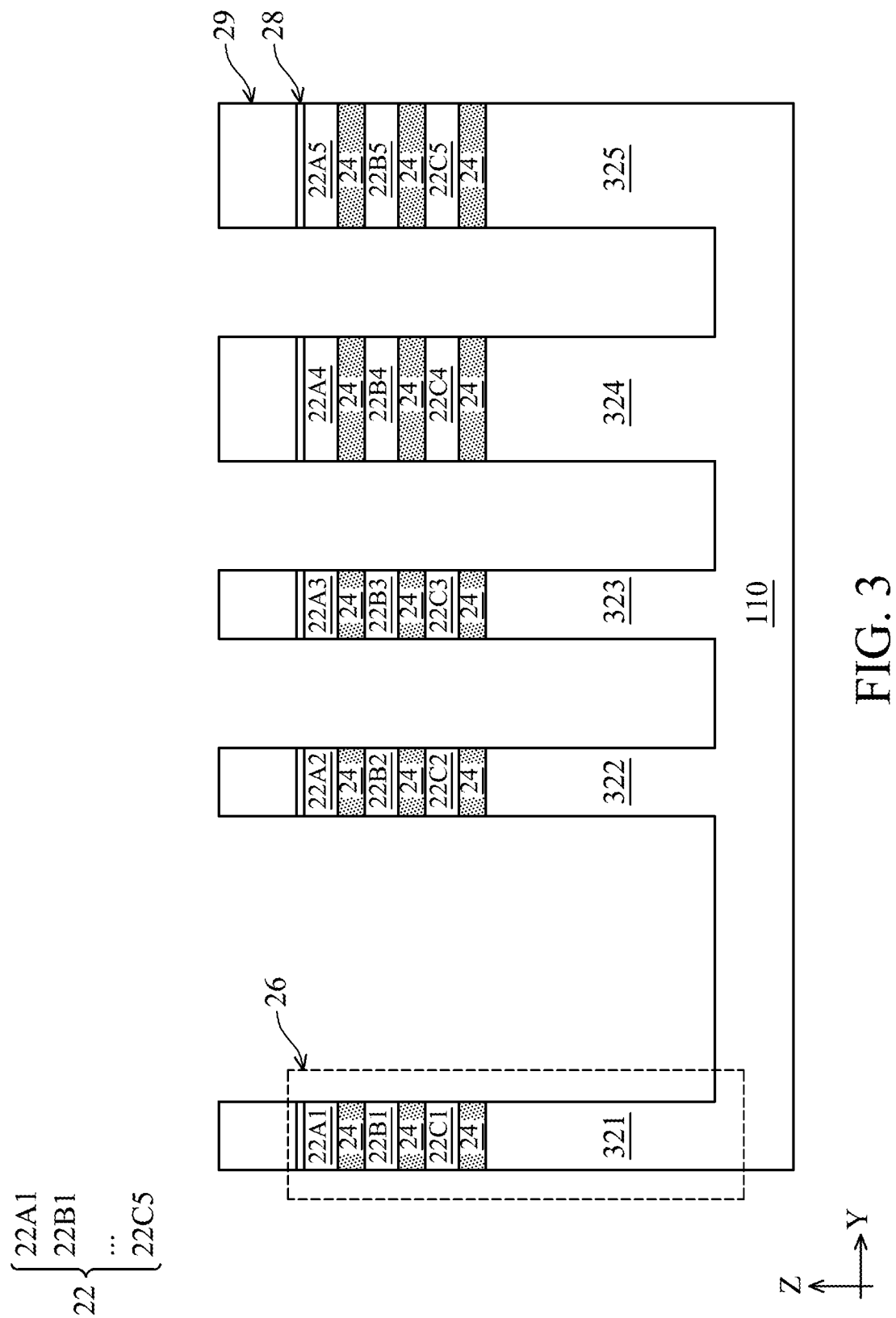

Further in FIG. 2, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like. As shown in FIG. 3, an oxide layer 28 and hard mask layer 29 are formed over the top first semiconductor layer 21A. In some embodiments, the oxide layer 28 is a pad oxide layer, and the hard mask layer 29 may include silicon.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

In FIG. 3, fins 321-325 are formed in the substrate 110 and nanostructures 22, 24 are formed in the multi-layer stack 25 corresponding to operation 1100 of FIG. 29. In some embodiments, the nanostructures 22, 24 and the fins 32 may be formed by etching trenches in the multi-layer stack 25 and the substrate 110. The etching may be any acceptable etch process, such as a reactive ion etch (ME), neutral beam etch (NBE), the like, or a combination thereof. The etching may be anisotropic. First nanostructures 22A1-22C5 (also referred to as "channels") are formed from the first semiconductor layers 21, and second nanostructures 24 are formed from the second semiconductor layers 23. Distance between adjacent fins 321-325 and nanostructures 22, 24 in the Y-direction may be from about 18 nm to about 100 nm.

The fins 321-325 and the nanostructures 22, 24 may be patterned by any suitable method. For example, one or more photolithography processes, including double-patterning or multi-patterning processes, may be used to form the fins 321-325 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 321-325. In some embodiments, the hard mask layer 29 is patterned, for example by a photolithography process, then the pattern is transferred by an etch process to form the fins 321-325 and the nanostructures 22, 24. Each of the fins 321-325 and its overlying nanostructures 22, 24 may be collectively referred to as a "fin stack." A fin stack 26 including the fin 321 and the nanostructures 22A1, 22B1, 22C1, 24 is outlined by a dashed line in FIG. 3. Five fin stacks 26 are shown in FIG. 3, though few or more than five fin stacks may also be formed by the patterning process.

FIG. 3 illustrates the fins 321-325 having vertically straight sidewalls. In some embodiments, the sidewalls are substantially vertical (non-tapered), such that width of the fins 321-325 and the nanostructures 22, 24 is substantially similar, and each of the nanostructures 22, 24 is rectangular in shape. In some embodiments, the fins 321-325 have tapered sidewalls, such that a width of each of the fins 321-325 and/or the nanostructures 22, 24 continuously increases in a direction towards the substrate 110. In such embodiments, each of the nanostructures 22, 24 may have a different width and be trapezoidal in shape.

Figure 4:
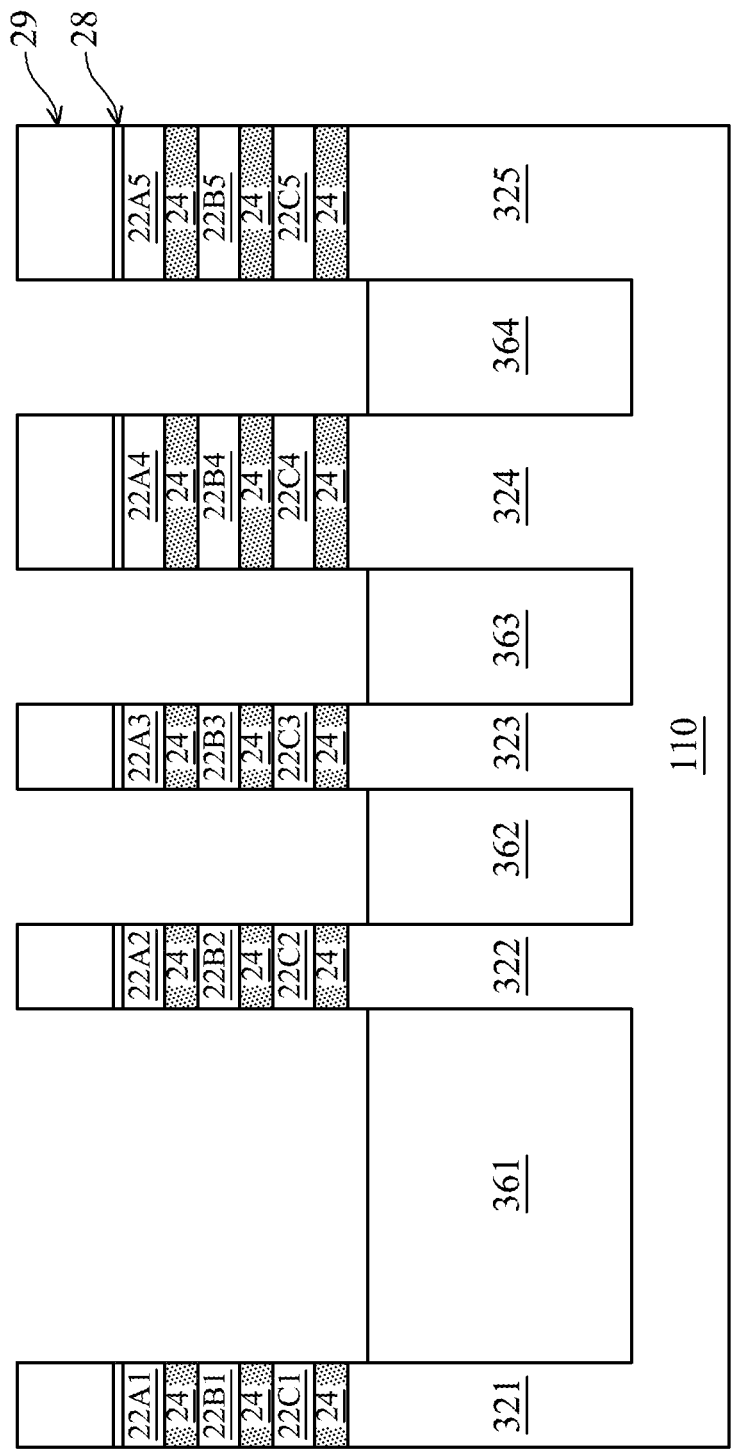

In FIG. 4, isolation regions 361-364, which may be shallow trench isolation (STI) regions, are formed adjacent and between the fins 321-325. The isolation regions 361-364 may be formed by depositing an insulation material over the substrate 110, the fins 321-325, and nanostructures 22, 24, and between adjacent fins 321-325 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 321-325, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. In some embodiments, top surfaces of the nanostructures 22, 24 may be exposed and level with the insulation material after the removal process is complete. In some embodiments, such as is shown in FIG. 4, the hard mask layer 29 and oxide layer 28 remain on the nanostructures 22 following the removal process.

The insulation material is then recessed to form the isolation regions 361-364. After recessing, the nanostructures 22, 24 and upper portions of the fins 321-325 may protrude from between neighboring isolation regions 361-364. The isolation regions 361-364 may have top surfaces that are flat as illustrated, convex, concave, or a combination thereof. In some embodiments, the isolation regions 361-364 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2 through 4 illustrate one embodiment (e.g., etch last) of forming the fins 321-325 and the nanostructures 22, 24. In some embodiments, the fins 321-325 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 4, appropriate wells (not separately illustrated) may be formed in the fins 321-325, the nanostructures 22, 24, and/or the isolation regions 361-364. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 321-325 and the nanostructures 22, 24 may obviate separate implantations, although in situ and implantation doping may be used together.

Figure 5:
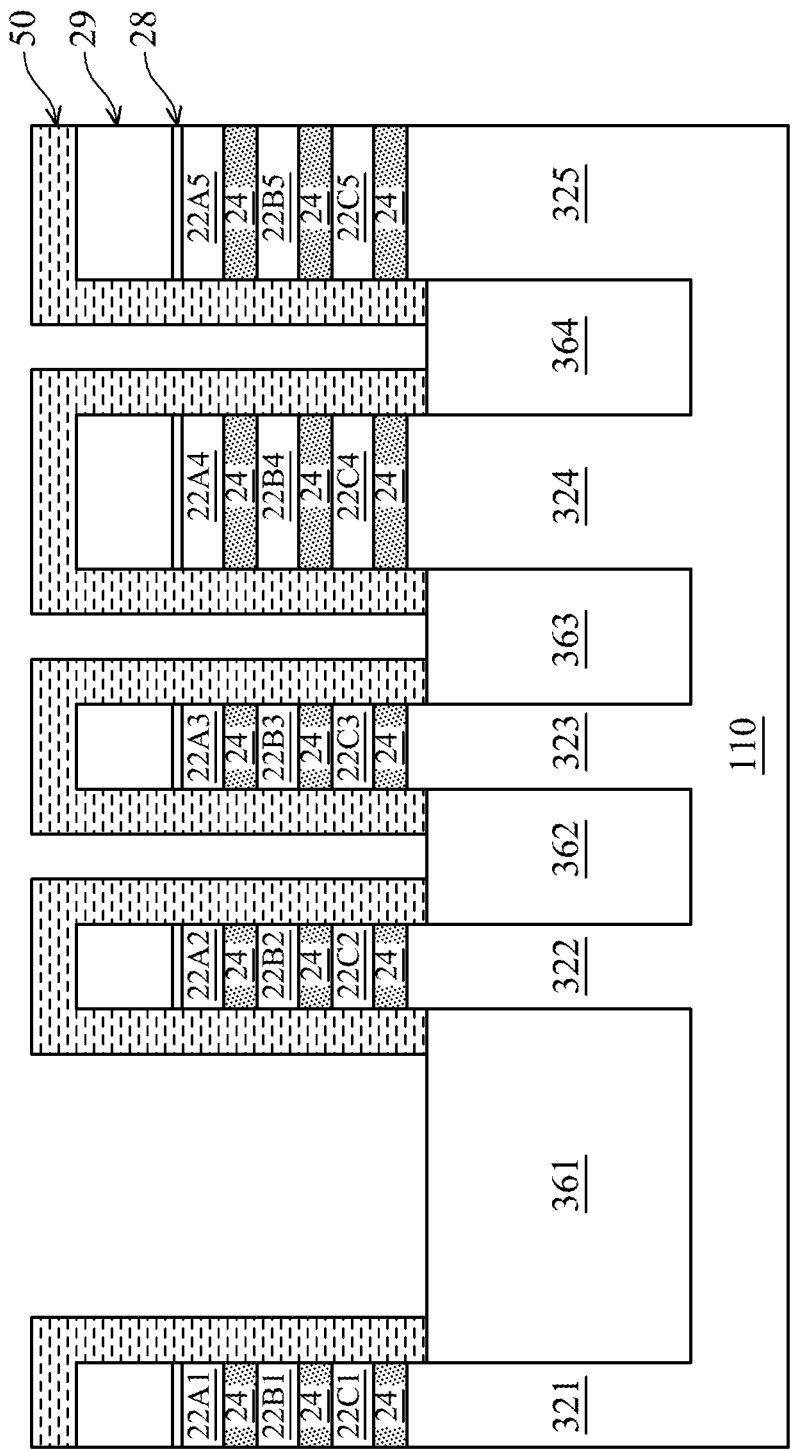

In FIG. 5, a cladding layer 50 is formed over and around the nanostructures 22, 24, upper portions of the fins 321-325, and peripheral portions of the isolation regions 361-364. The cladding layer 50 may be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. In some embodiments, the cladding layer 50 comprises SiGe. The isolation regions 361-365 may be exposed by performing an anisotropic etch after depositing the material of the cladding layer 50. Generally, as the cladding layer 50 is a temporary structure that will be removed with the nanostructures 24 prior to formation of the gate structures 200A-200E, the cladding layer 50 may comprise the same material as the nanostructures 24.

Figure 6:
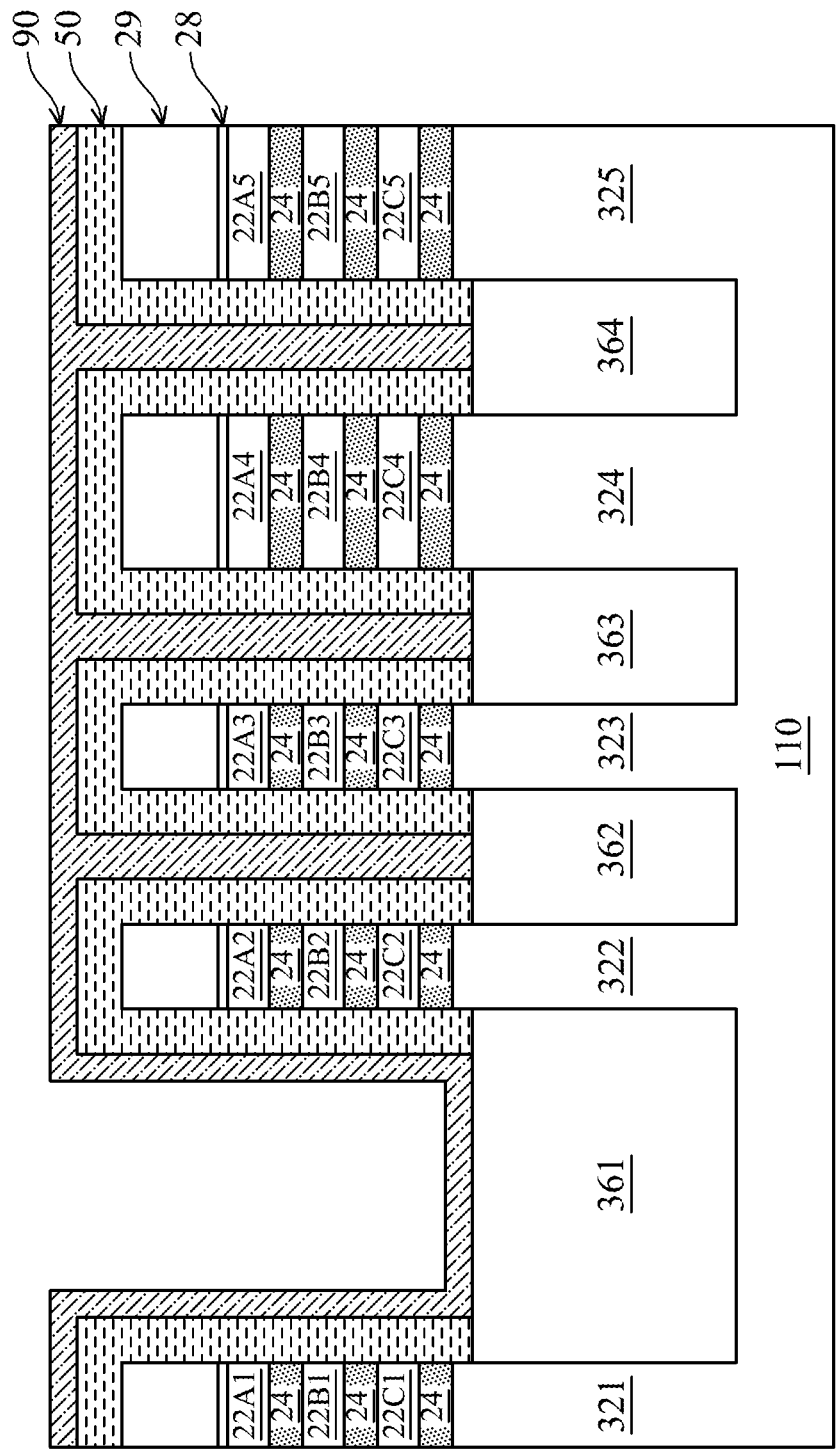
Figure 7:
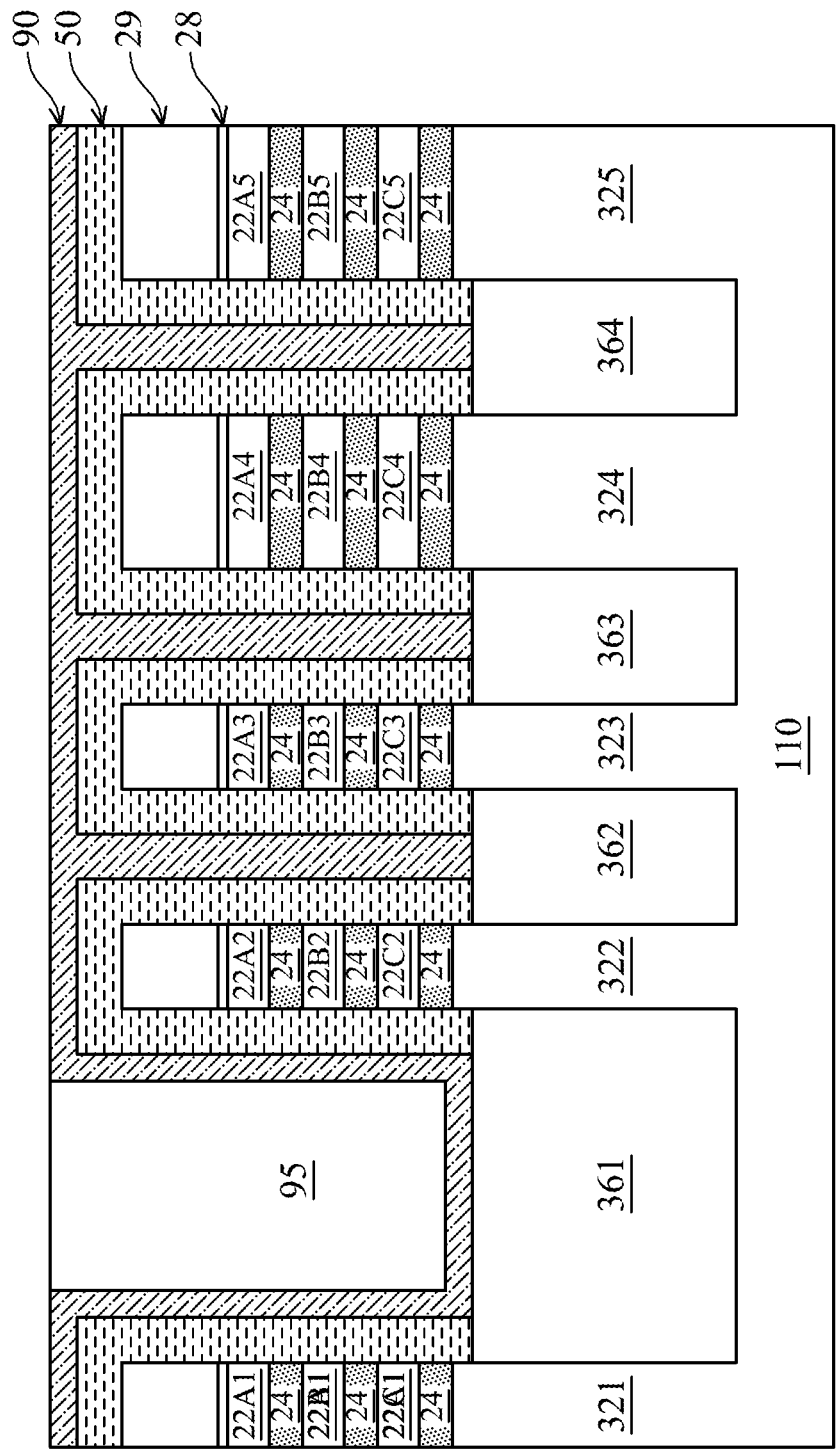
Figure 8:
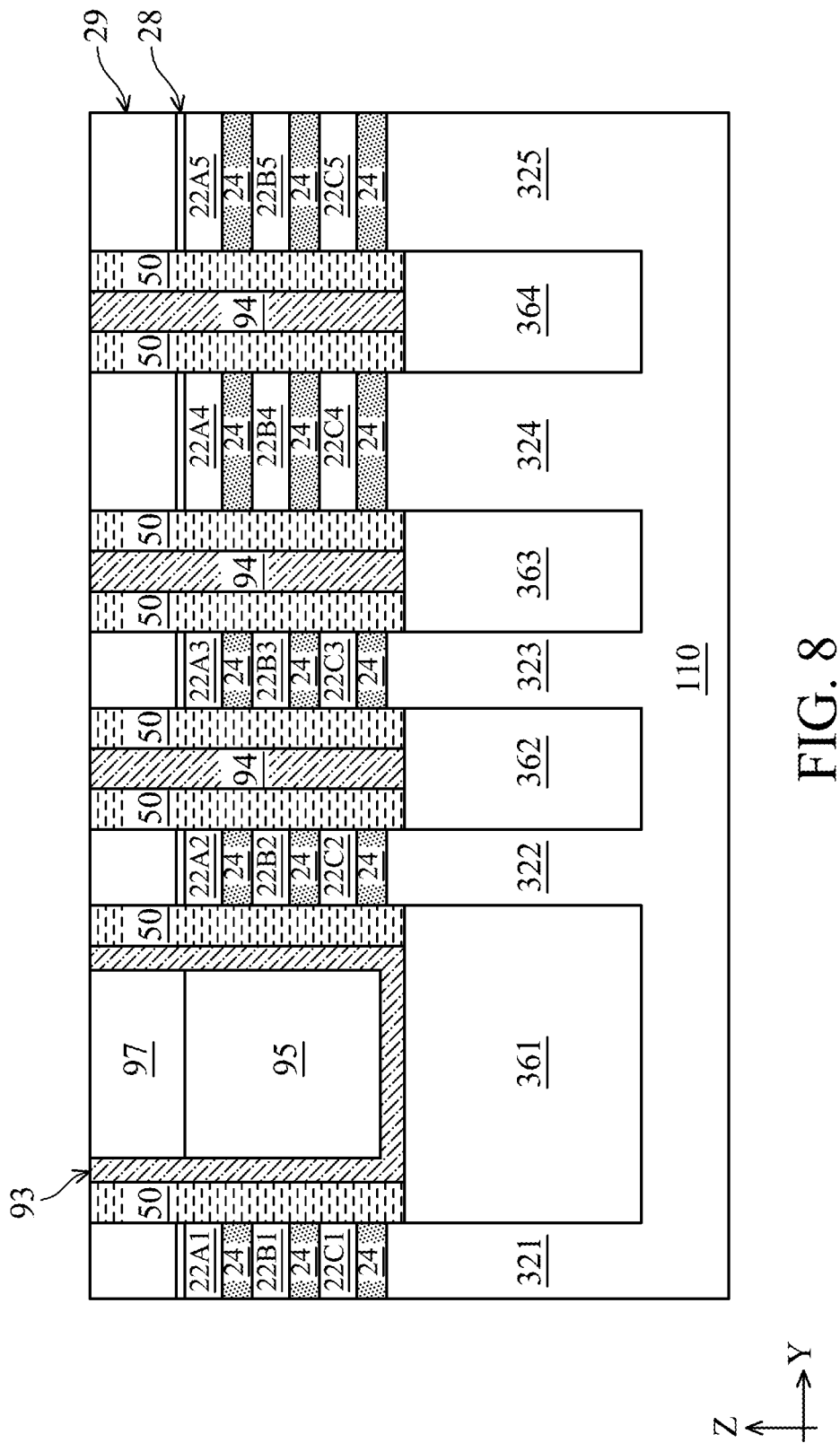

FIGS. 6-8 illustrate formation of the inactive fins 94 and the inactive block 92, corresponding to operation 1200 of FIG. 29. In FIG. 6, a dielectric layer 90 used for forming the inactive fins 94 and the inactive block 92 is formed between the cladding layer 50 and on the isolation regions 361-365. The dielectric layer 90 may be formed of a low-k dielectric material (such as one selected from the candidate dielectric materials of the inactive fins 94). The dielectric layer 90 can have a thickness in the range of about 6 nm to about 30 nm. As shown in FIG. 6, formation of the dielectric layer 90 over the isolation regions 362-364 is by a self-aligned process using the cladding layer 50. The self-aligned process allows for spacing between the respective fins 322-325 to be closer than would be possible if the dielectric layer 90 used for forming the inactive fins 94 were deposited in typical processes. In a typical process, the dielectric layer 90 would be deposited after formation and etching of the gate structures 200A-200E. Due to process constraints, particularly overlap/alignment rules, etching the gate structures 200A-200E, sometimes referred to as a "cut gate" process, requires a relatively large spacing between the fins 321-325, so as not to etch too close to the nanostructures 22 on either side of an opening formed by the etching. By depositing the dielectric layer 90 in the openings between vertical portions of the cladding layer 50 on sidewalls of the nanostructures 22, 24, not only is alignment ensured, but the spacing can be reduced, which allows for design and fabrication of smaller area circuit functional blocks with the same or better performance.

In FIG. 7, an oxide layer 95 is formed over the isolation structure 361, between sidewalls and over an upper surface of the portion of the dielectric layer 90 overlying the isolation region 361. In some embodiments, the oxide layer 95 comprises silicon oxide.

In FIG. 8, a removal process is performed to recess excess material of the cladding layer 50, the dielectric layer 90, and the oxide layer 95 to a level substantially coplanar with the top surface of the hard mask layer 29. The removal process may be a CMP process, in some embodiments, which forms the inactive fins 94, and a dielectric liner 93 and the oxide layer 95 of the inactive block 92. In some embodiments, the oxide layer 95 is further recessed to below the top surface of the dielectric layer 90 and the cladding layer 50, and the inactive fin cap 97 is formed over the oxide layer 95 between sidewalls of the dielectric layer 90. In some embodiments, the inactive fin cap 97 comprises a low-k dielectric material. In some embodiments, the inactive fin cap 97 comprises the same material as the dielectric liner 93. In some embodiments, the material of the oxide layer 95 is different from the material of the dielectric liner 93 and the inactive fin cap 97.

Figure 9:
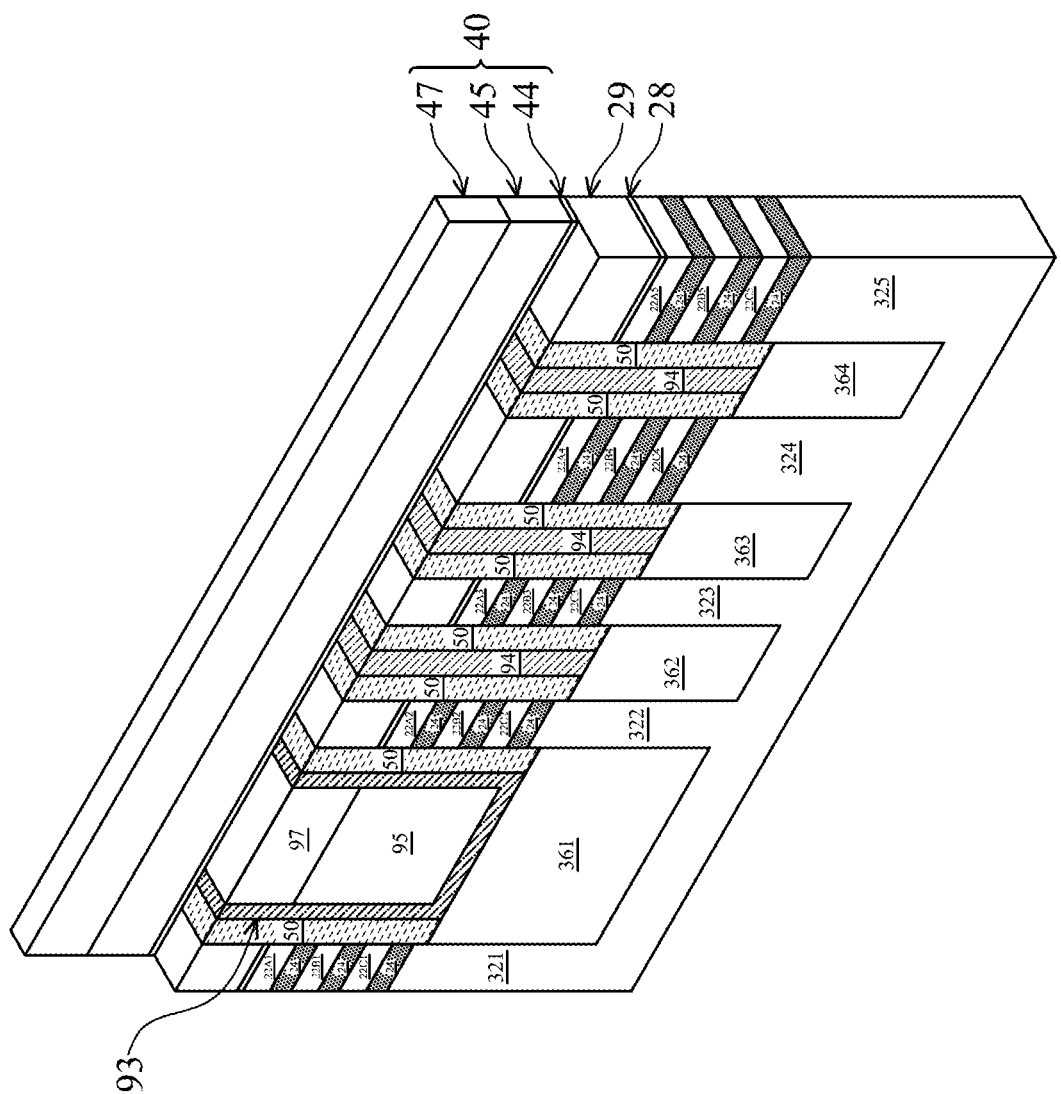

FIG. 9 is a perspective view of an intermediate stage of formation of the IC device 10 in accordance with various embodiments. Following formation of the inactive fin cap 97, dummy gate structures 40 are formed over the fins 321-325 and/or the nanostructures 22, 24. A single dummy gate structure 40 is shown in FIG. 9, and many further dummy gate structures 40 may be formed substantially parallel and concurrently with the dummy gate structure 40 shown. In forming the dummy gate structure 40, a dummy gate layer 45 is formed over the fins 321-325 and/or the nanostructures 22, 24. The dummy gate layer 45 may be made of materials that have a high etching selectivity to the isolation regions 361-364. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer 44 is formed before the dummy gate layer 45 between the dummy gate layer 45 and the fins 321-325 and/or the nanostructures 22, 24.

Figure 10:
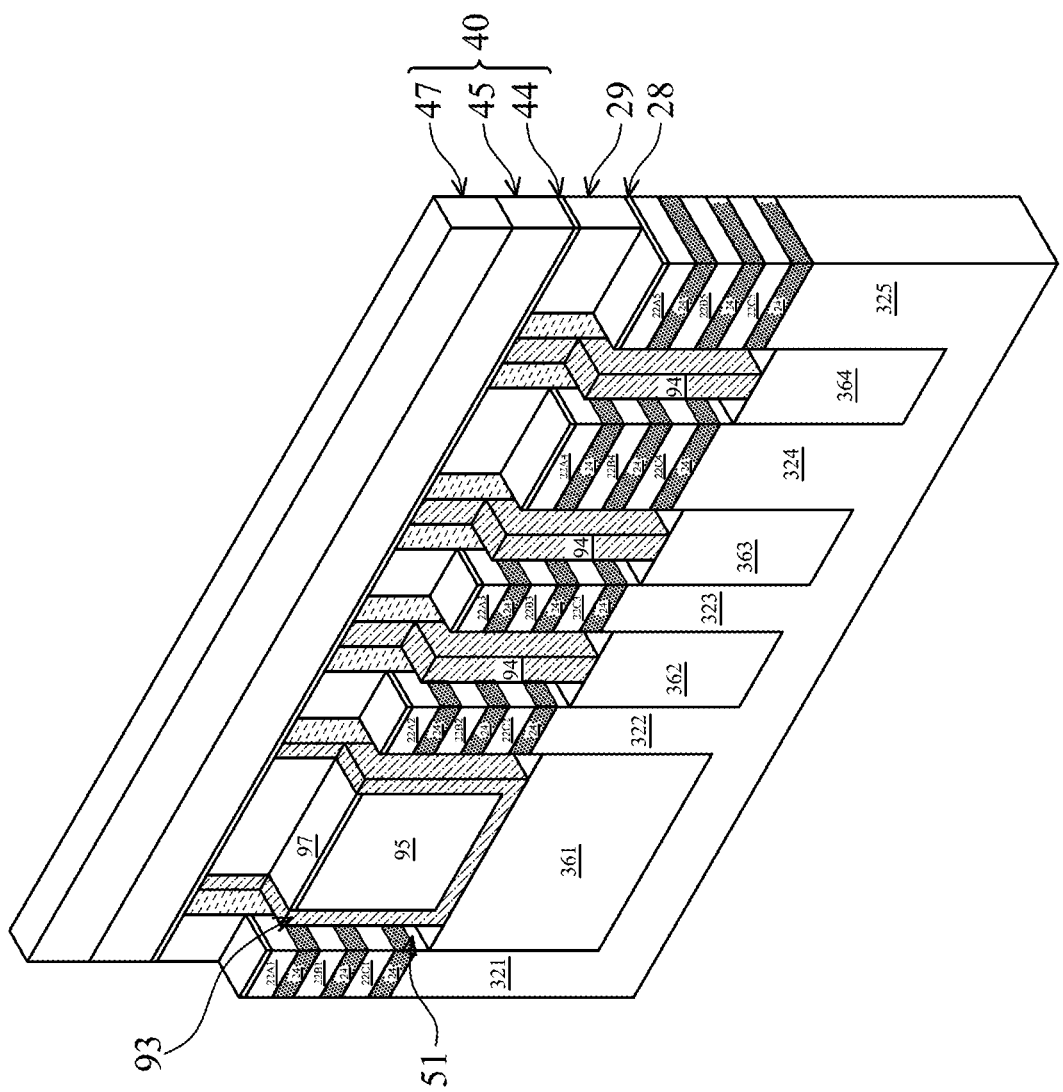

In FIG. 10, multiple removal processes are performed to remove exposed portions of the hard mask layer 29, the oxide layer 28, the inactive fins 94, the dielectric liner 93, the inactive fin cap 97, and the cladding layer 50 using the dummy gate structures 40 as a mask. The cladding layer 50 may be trimmed using an acceptable etching process, such as one that is selective to the cladding layer 50 (e.g., selectively etches the material(s) of the cladding layer 50 at a faster rate than the material(s) of the nanostructures 22A1-22C5, 24 and the inactive fins 94). The recessing/trimming may remove some of the nanostructures 24.

FIGS. 11-13 illustrate formation of the dielectric isolation features 48 abutting the inactive fins 94 and the inactive block 92, corresponding to operation 1300 of FIG. 29. In FIG. 11, the first dielectric layer 42, which is also referred to as "spacer layer 42," is formed over sidewalls of the mask layer 47, the dummy gate layer 45, the gate dielectric layer 44, the hard mask layer 29, the oxide layer 28, the nanostructures 22, 24, the inactive fins 94, the inactive block 92, and the isolation regions 361-364, e.g., by a conformal deposition process. The spacer layer 42 is made of an insulating material, such as silicon nitride, silicon oxide, silicon carbo-nitride, silicon oxynitride, silicon oxy carbo-nitride, or the like.

In FIG. 12, the liner dielectric layer 43 is formed in spaces between neighboring sidewalls of the spacer layer 42, as shown. The liner dielectric layer 43 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfSiO, HfZrO, $ZrO_2$, $Ta_2O_5$, or combinations thereof. The liner dielectric layer 43 fills in the spaces, such that top surfaces of the liner dielectric layer 43 are substantially coplanar with top surfaces of the spacer layer 42 overlying the nanostructures 22, 24 and the inactive fins 94. In some embodiments, the liner dielectric layer 43 is formed by a deposition process, such as CVD, ALD, or another suitable process. The deposition process may be followed by an etching process, such as an isotropic etch process, to remove excess material of the liner dielectric layer 43 outside of the spaces, e.g., on an upper surface and upper sidewalls of the spacer layer 42.

In FIG. 13, a second spacer layer 49 is formed over the mask layer 47, the dummy gate layer 45, the gate dielectric layer 44, the hard mask layer 29, the oxide layer 28, the nanostructures 22, 24, the inactive fins 94, the inactive block 92, the liner dielectric layer 43, and the isolation regions 361-364, e.g., by a conformal deposition process. The second spacer layer 49 is or comprises an insulating material, such as silicon nitride, silicon oxide, silicon carbo-nitride, silicon oxynitride, silicon oxy carbo-nitride, or the like. In some embodiments, the second spacer layer 49 and the space layer 42 are made of the same material. In some embodiments, the spacer layer 42 and the second spacer layer 49 is or comprise polysilicon.

Following deposition of the second spacer layer 49, horizontal (X-Y plane) surfaces of the second spacer layer 49 are removed, then one or more etching processes are performed to etch the portions of protruding fins 321-325 and/or nanostructures 22, 24 that are not covered by dummy gate structures 40, the spacer layer 42, and the second spacer layer 49, resulting in the structure shown. The etching may be anisotropic, such that the portions of fins 321-325 directly underlying dummy gate structures 40 and the spacer layer 41 are protected, and are not etched. The top surfaces of the recessed fins 321-325 may be substantially coplanar with the top surfaces of the isolation regions 361-364, or slightly below the top surfaces of the isolation regions 361-364, as shown, in accordance with some embodiments.

A further etching process or processes may be performed to recess the dielectric isolation features 48, the inactive fins 94, the first dielectric layer 42, the liner dielectric layer 43, and the inactive block 92. The further etching process may fully remove exposed portions of inactive fin cap 97. The further etching process may also recess exposed portions of the oxide layer 95 and the dielectric liner 93.

Figure 14:
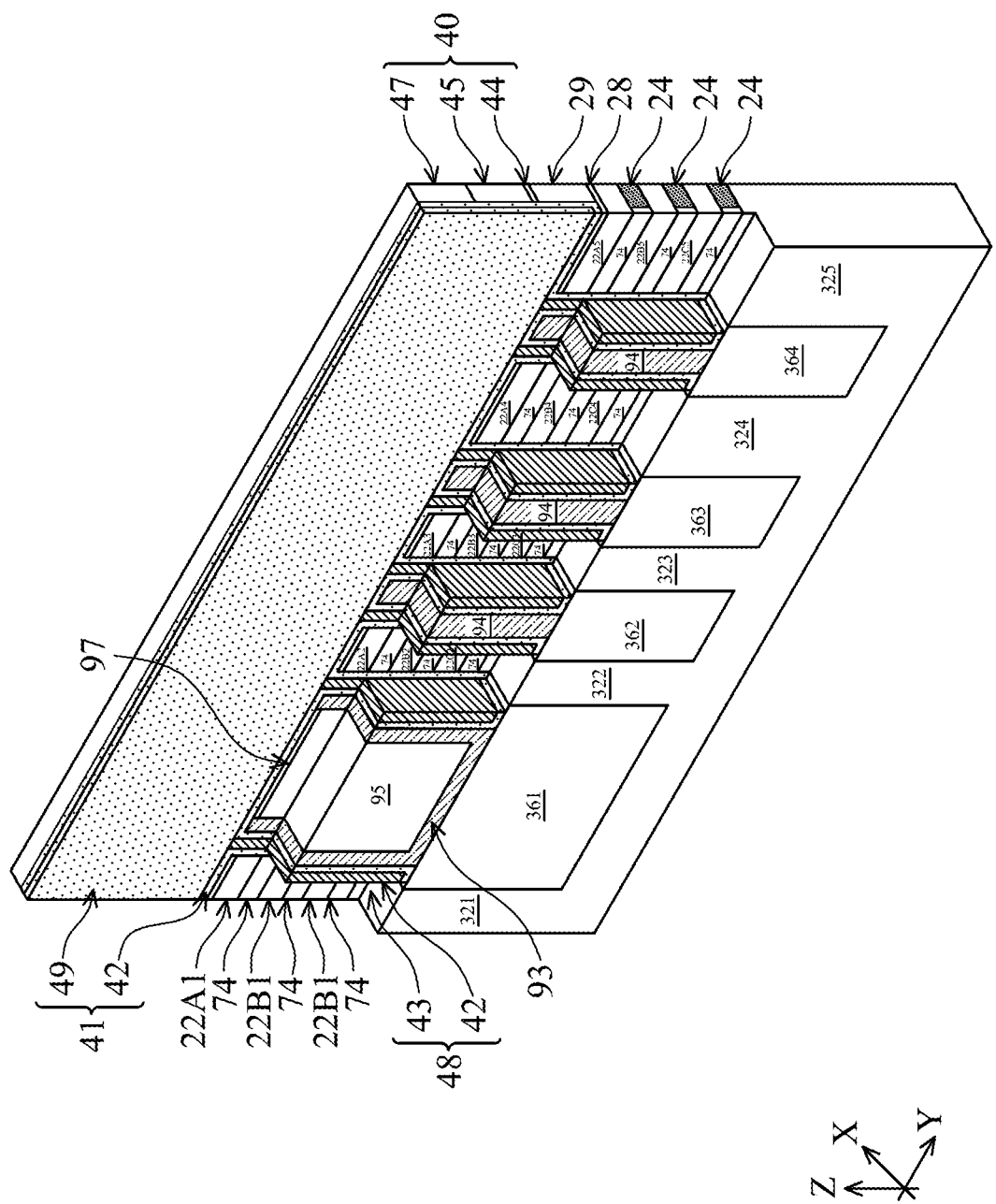

FIG. 14 illustrates formation of inner spacers 74. A selective etching process is performed to recess exposed end portions of the nanostructures 24 without substantially attacking the nanostructures 22. After the selective etching process, recesses are formed in the nanostructures 24 at locations where the removed end portions used to be. Next, an inner spacer layer is formed to fill the recesses between the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses in the nanostructures 24) form the inner spacers 74. The resulting structure is shown in FIG. 14.

Figure 15:
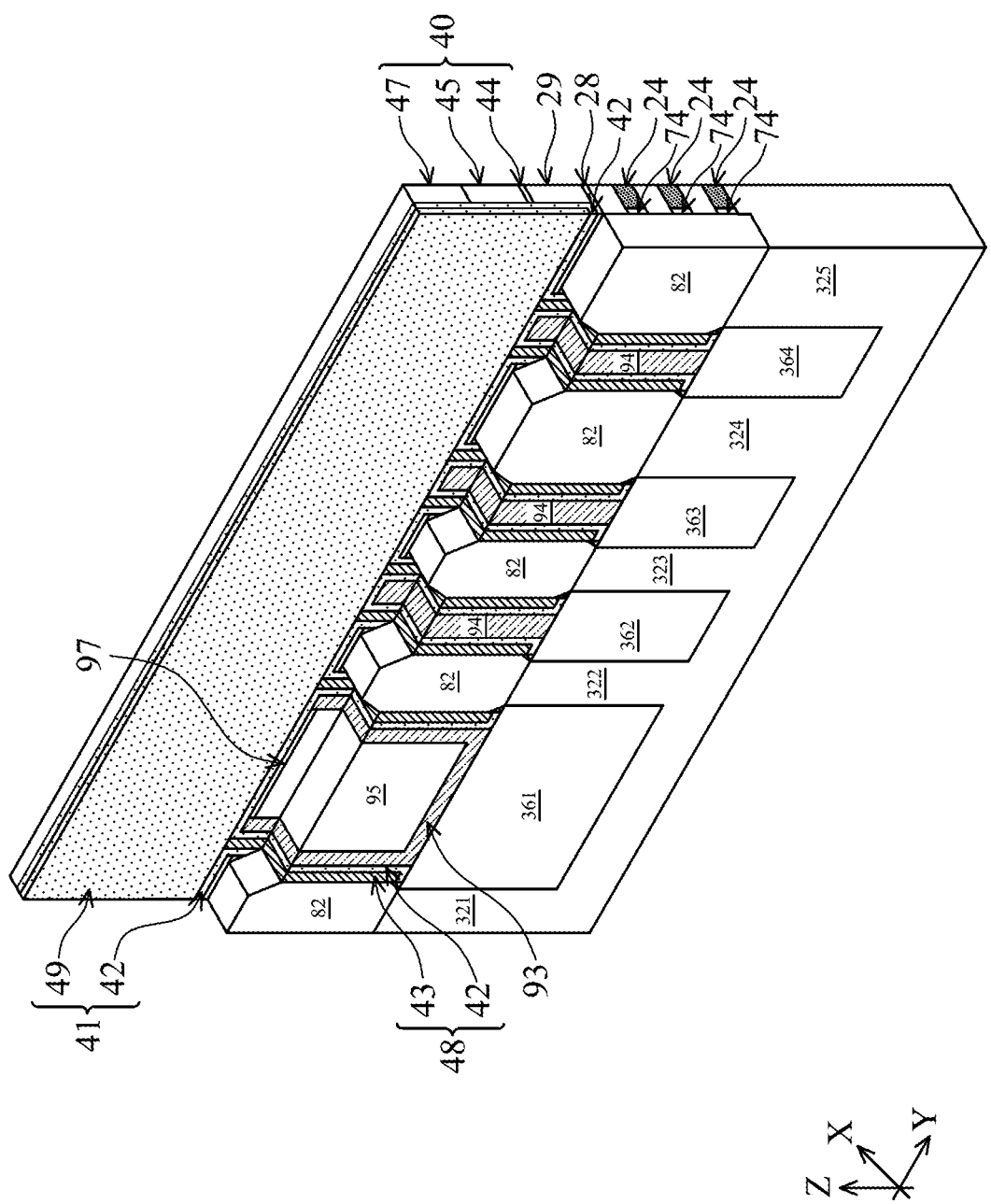

FIG. 15 illustrates formation of the source/drain regions 82 between the dielectric isolation features 48, corresponding to operation 1400 of FIG. 29. In the illustrated embodiment, the source/drain regions 82 are epitaxially grown from epitaxial material(s). In some embodiments, due to reduced spacing between the inactive fins 94 including the dielectric isolation features 48, the source/drain regions 82 are grown substantially without lateral growth. In some embodiments, the source/drain regions 82 exert stress in the respective channels 22A1-22C5, thereby improving performance. The source/drain regions 82 are formed such that each dummy gate structure 40 is disposed between respective neighboring pairs of the source/drain regions 82. In some embodiments, the spacer layer 42, the second spacer layer 49, and the inner spacers 74, separate the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 321-325.

The source/drain regions 82 may be implanted with dopants followed by an anneal. The source/drain regions may have an impurity concentration of between about $10^{19}$ $cm^{-3}$ and about $10^{21}$ $cm^{-3}$. N-type and/or p-type impurities for source/drain regions 82 may be any of the impurities previously discussed. In some embodiments, the source/drain regions 82 are in situ doped during growth. A contact etch stop layer (CESL) and interlayer dielectric (ILD), not illustrated for simplicity, may then be formed covering the dummy gate structures 40 and the source/drain regions 82.

Figure 16:
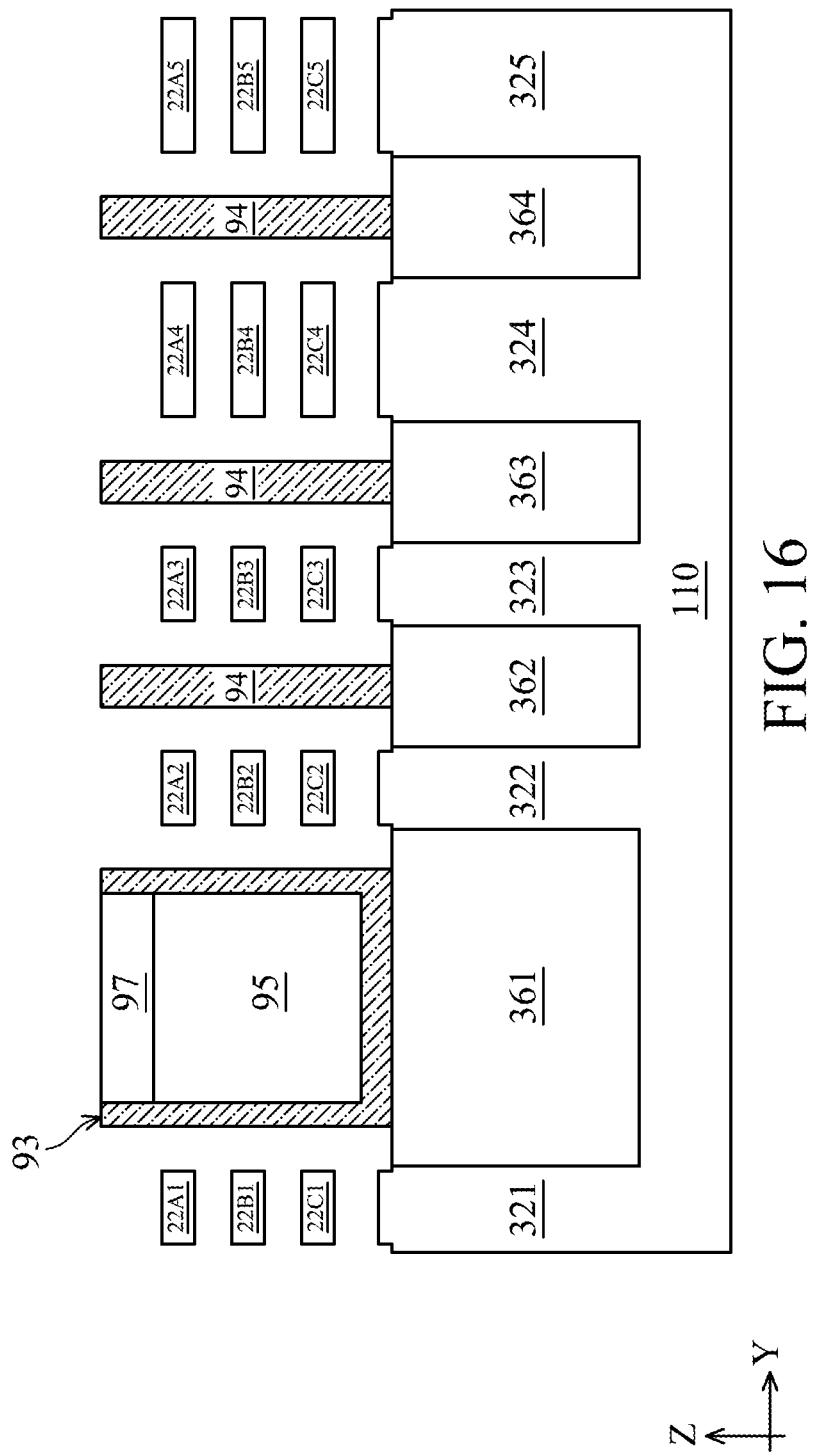

In FIG. 16, fin channels 22A1-22C5 are released by removal of the nanostructures 24, the mask layer 47, and the dummy gate layer 45, which corresponds to operation 1500 of FIG. 29. Prior to release, a planarization process, such as a CMP, is performed to level the top surfaces of the dummy gate layer 45 and gate spacer layer 41. The planarization process may also remove the mask layer 47 on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric 44, when present, may be used as an etch stop layer when the dummy gate layer 45 is etched. The dummy gate dielectric 44 may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the GAA devices 20A-20E formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs. In some other embodiments, the nanostructures 22 may be removed and the nanostructures 24 may be patterned to form channel regions of both PFETs and NFETs.

In some embodiments, the nanosheets 22 of the GAA devices 20A-20E are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

While not shown in FIGS. 15-16 for simplicity of illustration, prior to removal of the nanostructures 24, the mask layer 47, and the dummy gate layer 45, the ILD 130 is deposited over the source/drain features 82, the inactive fins 94, the dielectric liner 93, the oxide layer 95, and the dielectric isolation features 48. The etch stop layer 131 may also be formed prior to deposition of the ILD 130 (see FIG. 22A). Following deposition of the ILD 130, the ILD 130 may be recessed slightly, and a second etch stop layer 132 may be formed over the ILD 130 in the recess. A CMP operation or the like may then be performed to remove excess material of the second etch stop layer 132, such that an upper surface of the second etch stop layer 132 is substantially planar with upper surfaces of the etch stop layer 131 and the gate spacers 41.

Figure 17A:
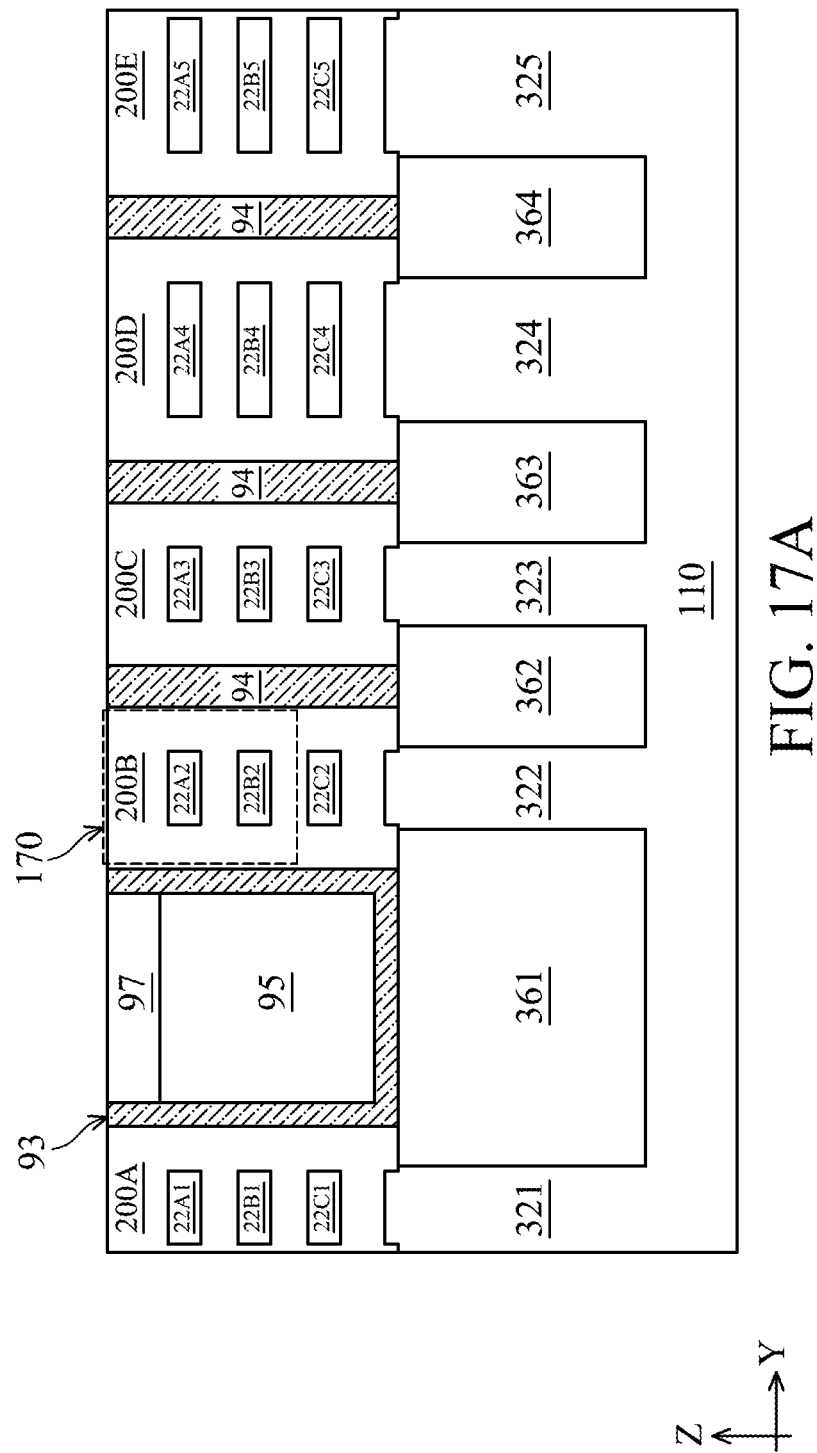
Figure 17B:
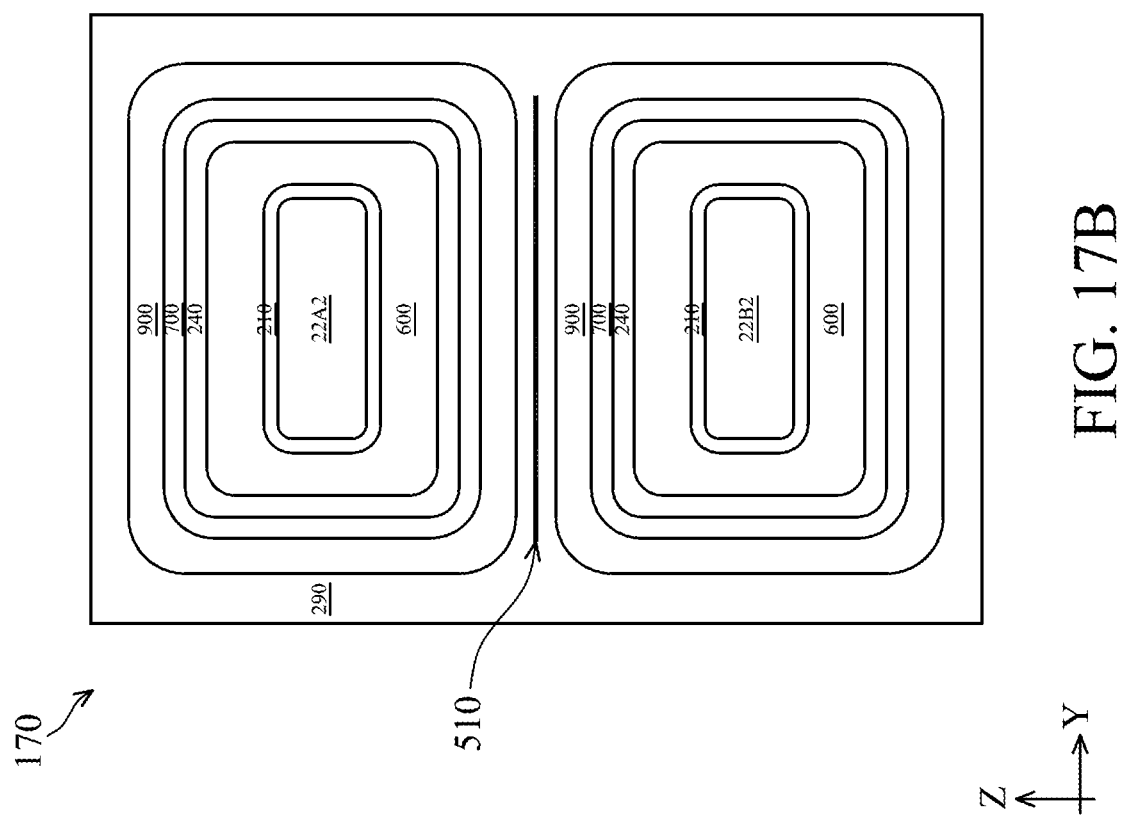

Next, in FIGS. 17A-17B, replacement gates 200, such as the gate structures 200A-200E, are formed, corresponding to operation 1600 of FIG. 29. FIG. 17B is a detailed view of the region 170 of FIG. 17A corresponding to a portion of the gate structure 200B. Each replacement gate 200, as illustrated by the gate structure 200B in FIG. 17B, generally includes the interfacial layer (IL, or "first IL" below) 210, at least one gate dielectric layer 600, the work function metal layer 900, and the gate fill layer 290N or 290P. In some embodiments, each replacement gate 200 further includes at least one of a second interfacial layer 240 or a second work function layer 700.

With reference to FIG. 17B, in some embodiments, the first IL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms.

Still referring to FIG. 17B, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 220 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the GAA device 20B.

With further reference to FIG. 17B, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200B, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfSiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

Further in FIG. 17B, after forming the second IL 240 and removing the high-k capping layer, the work function barrier layer 700 is optionally formed on the gate structure 200B, in accordance with some embodiments. The work function barrier layer 700 is or comprises a metal nitride, such as TiN, WN, MoN, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility.

In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 17B further illustrates the metal fill layer 290. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. In some embodiments, a seam 510, which may be an air gap, is formed in the metal fill layer 290 vertically between the channels 22A2, 22B2. In some embodiments, the metal fill layer 290 is conformally deposited on the work function metal layer 900. The seam 510 may form due to sidewall deposited film merging during the conformal deposition. In some embodiments, the seam 510 is not present between the neighboring channels 22A2, 22B2.

At this point, all of the gate structures 200A-200E are electrically isolated from each other. FIGS. 18-23C illustrate a process for electrically connecting certain of the gate structures 200A-200E while electrically isolating other of the gate structures 200A-200E, in accordance with some embodiments.

Figure 18:
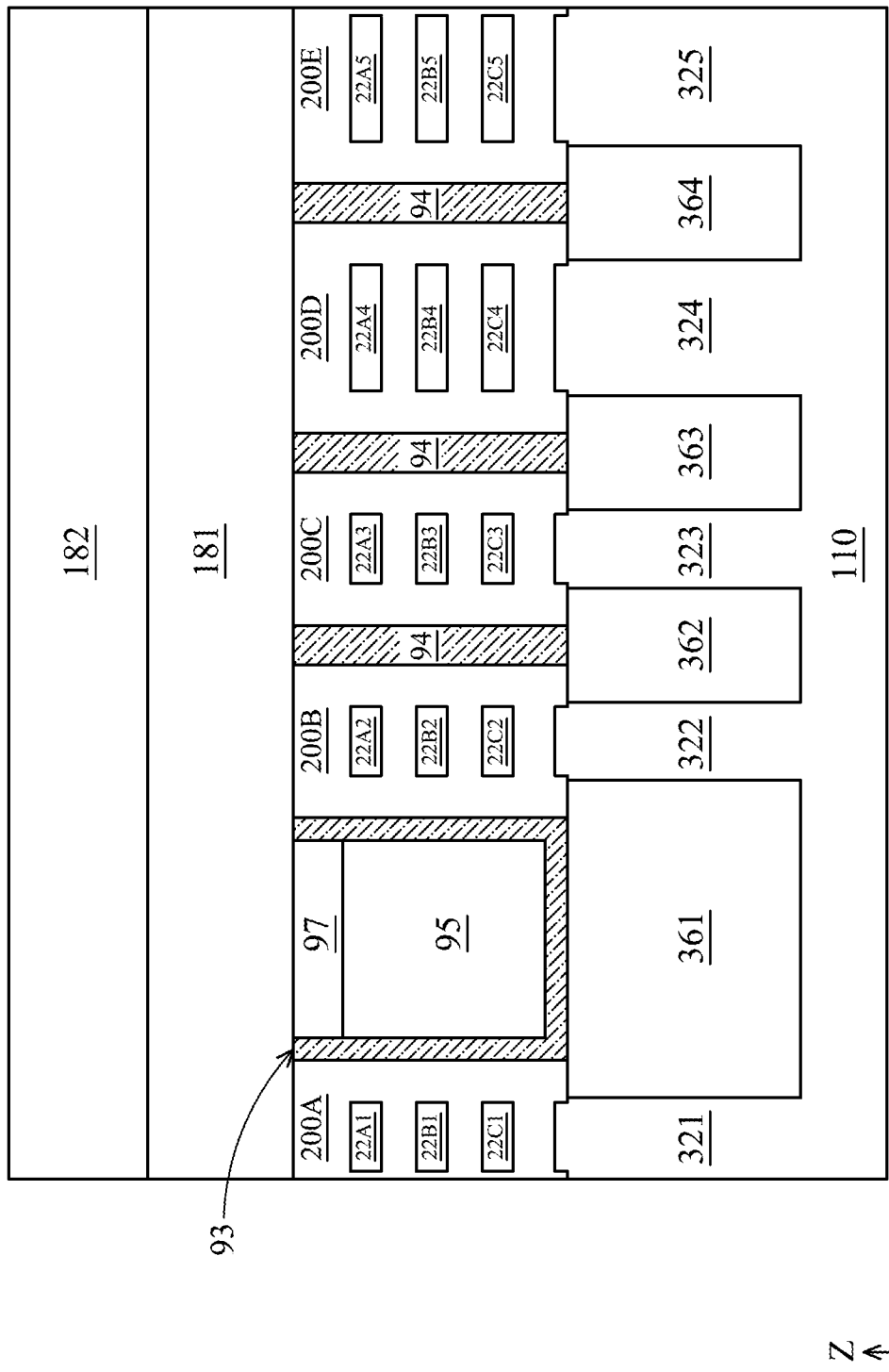

FIGS. 18-21 illustrate formation of dielectric plugs 99 over the inactive fins 94 and/or the inactive block 92, corresponding to operation 1700 of FIG. 29. In FIG. 18, a first mask layer 181 and a hard mask layer 182 are formed over the gate structures 200A-200E, the inactive fins 94, the dielectric liner 93, and the inactive fin cap 97. The first mask layer 181 includes silicon, such as polycrystalline silicon or amorphous silicon. The thickness of the first mask layer 181 is in a range from about 100 nm to about 200 nm, in some embodiments. In some embodiments, the first mask layer is subjected to a planarization operation. The first mask layer 181 and the hard mask layer 182 are deposited using any suitable processes, including spin coating, LPCVD, PECVD, PVD, ALD, or other suitable processes. The hard mask layer 182 includes one or more layers of SiN, SOC, or the like, in accordance with some embodiments.

Figure 19:
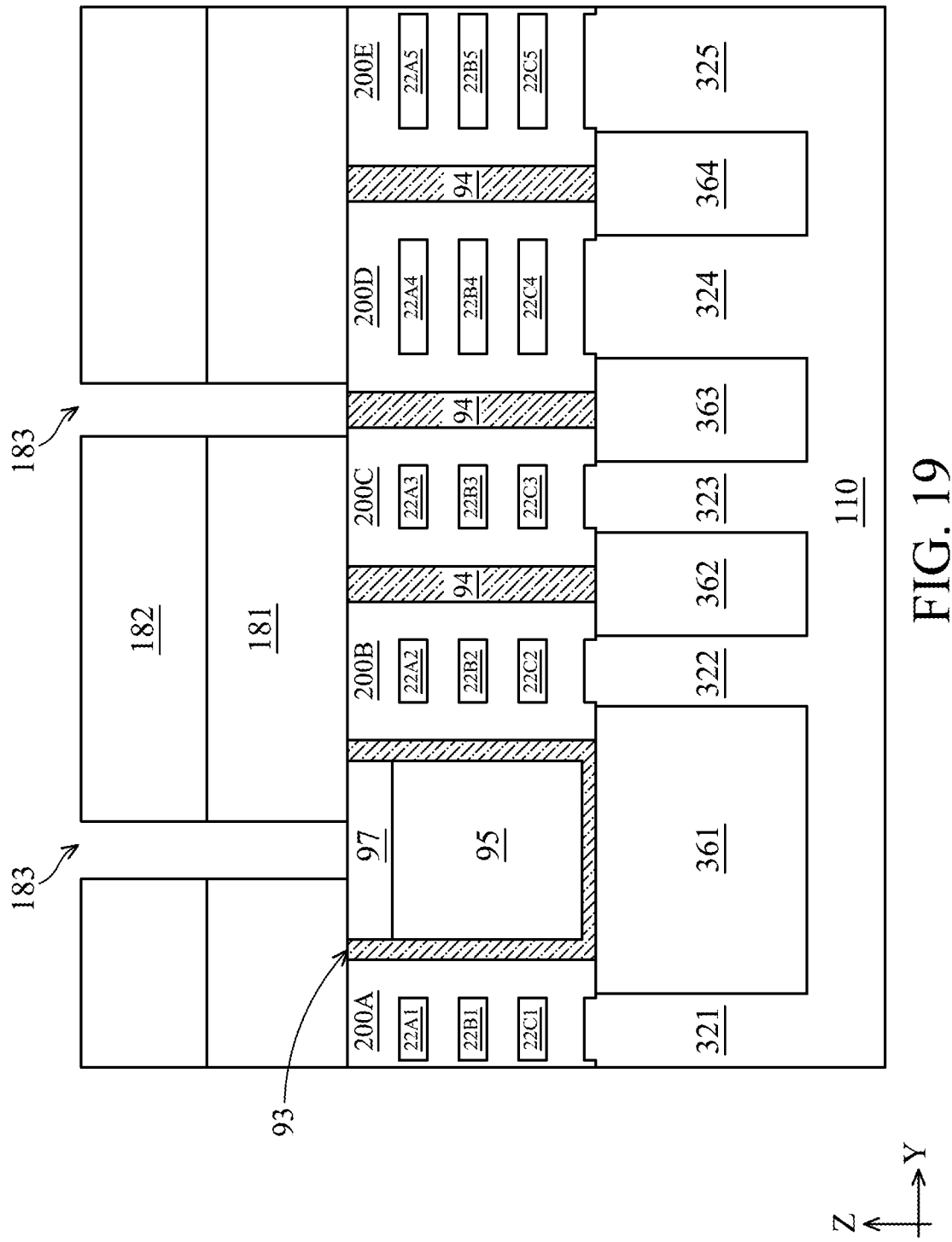

In FIG. 19, the hard mask layer 182 and the first mask layer 181 are etched to form openings 183 over and exposing certain of the inactive fins 94 and the inactive fin cap 97. As illustrated in FIG. 19, one of the openings 183 is formed over and exposing the inactive fin cap 94 over the isolation structure 363. When formed over one of the inactive fins 94, the opening 183 may have width (in the Y-direction) substantially equal to width of the inactive fin 94, though larger or smaller widths may also be suitable. The opening 183 over the inactive fin 94 will generally also be substantially aligned with the inactive fin 94, though some misalignment may occur due to alignment shift.

To form the openings 183, in some embodiments, a photoresist pattern (not separately illustrated) is formed over the hard mask layer 182, and the hard mask layer 182 is etched first by an anisotropic etching process selective to the material of the hard mask layer 182, which forms an upper portion of the openings 183 extending from the upper surface of the hard mask layer 182 to expose the upper surfaces of the first mask layer 181 over the inactive fin 94 and the inactive fin cap 97. Following etching of the hard mask layer 182, the photoresist pattern may be removed, and the hard mask layer 182 may be used as a mask while forming a lower portion of the openings 183 extending from the upper surface of the first mask layer 181 to expose the upper surfaces of the inactive fin 94 and the inactive fin cap 97. The lower portion is formed by etching the first mask layer 181 by, for example, an anisotropic etching process selective to the material of the first mask layer 181.

Figure 20:
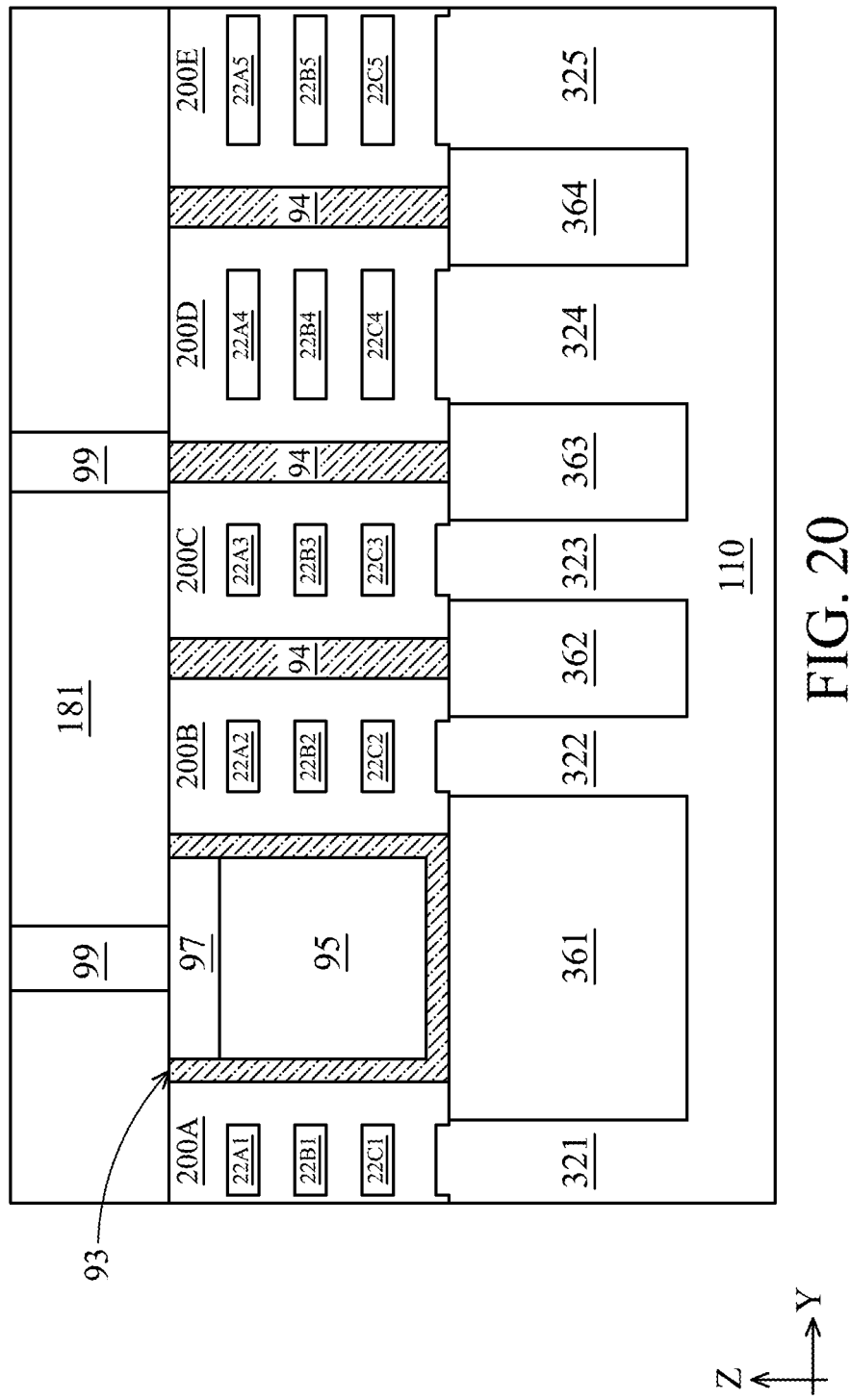

In FIG. 20, following formation of the openings 183, dielectric plugs 99 are formed in the openings 183. In some embodiments, the dielectric plugs 99 are or include silicon nitride, silicon oxide, Al2O3, ZrO2 or another suitable material. The dielectric plugs 99 may be deposited in the openings 183 by a suitable process, such as CVD and/or other suitable technique. Following deposition of the dielectric plugs 99, a removal process, such as CMP or another suitable process, can be performed to remove excess material of the dielectric plugs 99 from over the first mask layer 181, such that upper surfaces of the dielectric plugs 99 are substantially level with upper surfaces of the first mask layer 181. The dielectric plugs 99 generally inherit the shape of the openings 183, such that the dielectric plug 99 over the inactive fin 94 is substantially aligned with the inactive fin 94 and has similar width to the inactive fin 94. The dielectric plug 99 over the inactive fin cap 97 may have width about $\frac{1}{100}^{th}$ to ½ the width of the inactive fin cap 97, and may be aligned over a center (in the Y-direction) of the inactive fin cap 97. In some embodiments, the dielectric plug 99 over the inactive fin cap 97 partially covers the dielectric liner 93.

Figure 21:
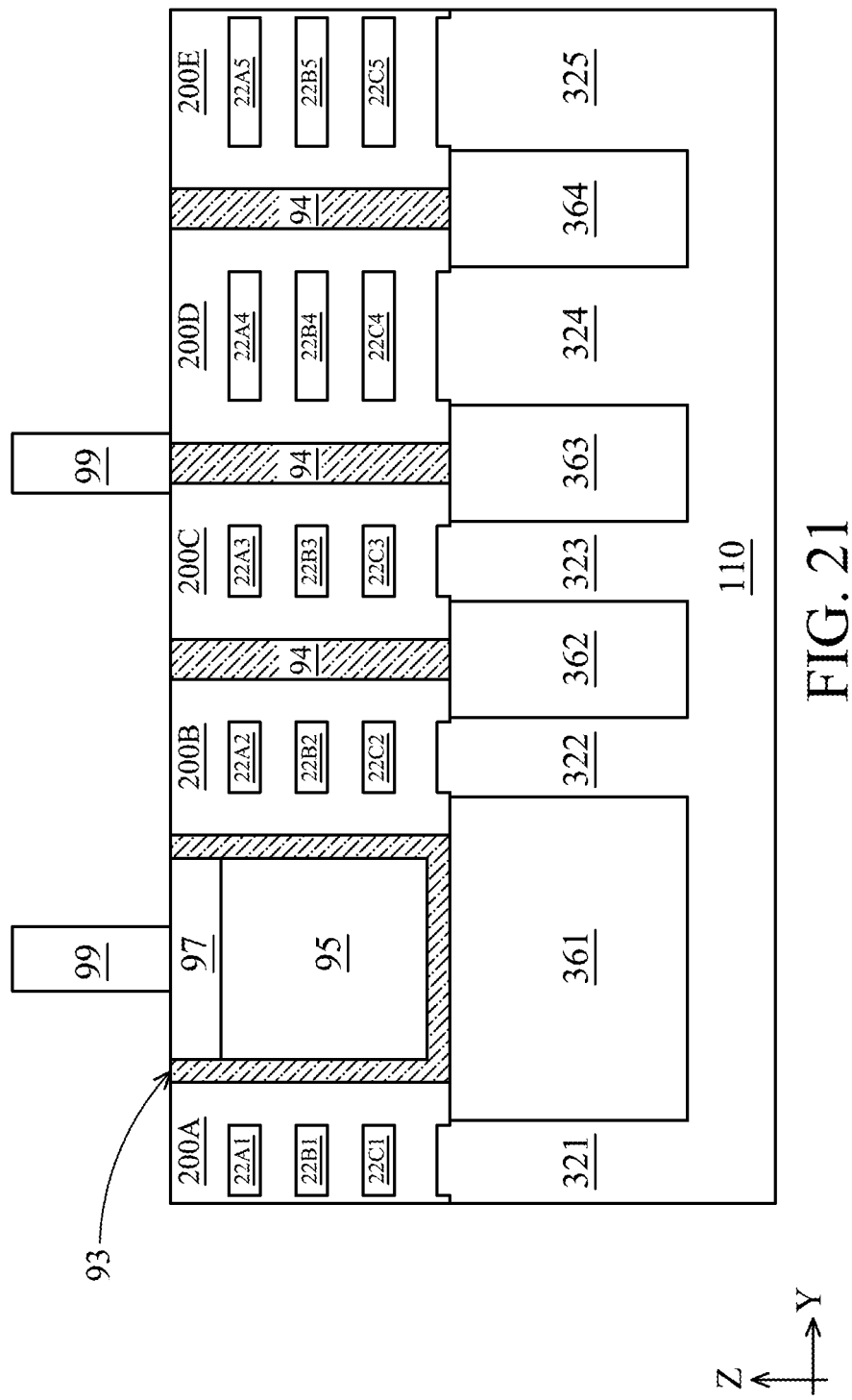

Following formation of the dielectric plugs 99, the first mask layer 181 is removed, leaving the dielectric plugs 99 over the inactive fin 94 and the inactive fin cap 97. In some embodiments, the first mask layer 181 is removed by a reactive ion etch (RIE) process, or other suitable process. The resultant structure is shown in FIG. 21. At this point, all of the gate structures 200A-200E remain electrically isolated from each other.

FIGS. 22A-22C are views along the X-Z plane, similar to what is shown in FIG. 1D. FIGS. 22A-22C illustrate electrical connection of neighboring gate structures 200A-200E, such as the gate structures 200B and 200C or the gate structures 200D and 200E, corresponding to operation 1800 of FIG. 29. While two neighboring gate structures of the gate structures 200A-200E are electrically connected in the figures, it is appreciated that three or more neighboring gate structures may be electrically connected with proper placement of the dielectric plug 99, in some embodiments.

In FIG. 22A, the adhesive layer 260 is formed. Prior to formation of the adhesive layer 260, an etch stop layer 132 may be formed over the ILD 130. The adhesive layer 260 is formed over the etch stop layer 132, the etch stop layer 131, the gate spacers 41, and the gate structures 200A-200E. The adhesive layer 260 comprises or is a material that prevents diffusion of metal and/or fluorine between a bridge conductor layer 204 (see FIG. 22C) and surrounding layers/structures, such as the metal fill layer 290 and also promotes adhesion of the bridge conductor layer 204 to the gate structures 200A-200E. In some embodiments, the adhesive layer 260 is or comprises a metal nitride, such as TiN, or other suitable material. In some embodiments, the adhesive layer 260 is formed by a deposition process, such as PVD, or other suitable process. In some embodiments, thickness of the adhesive layer 260 is thicker on horizontal surfaces (substantially in the X-Y plane, or "horizontal thickness") than on vertical surfaces (substantially in the Y-Z plane, or "vertical thickness"). For example, the horizontal thickness may refer to thickness of the adhesive layer 260 on the upper surface of the metal fill layer 290, and the vertical thickness may refer to thickness of the adhesive layer 260 on sidewalls of the first dielectric layer 42 and/or the second spacer layer 49. In some embodiments, the horizontal thickness is thicker than the vertical thickness by an amount, for example, greater than 1 nm. In some embodiments, ratio of the horizontal thickness to the vertical thickness is at least about 1.5. In some embodiments, the horizontal thickness is about 2 nm, and the vertical thickness is less than about 1 nm.

In FIG. 22B, the adhesive layer 260 is recessed by an etching process to establish a nucleation region in which the bridge conductor layer 204 will be deposited. In some embodiments, an anti-reflective material layer (not shown for simplicity) is filled in the opening 250 over the adhesive layer 260 prior to etching, then the anti-reflective material layer is etched back to a height H1 above the metal fill layer 290. Following etch back of the anti-reflective material layer, which is a material that is different from the adhesive layer 260, portions of the adhesive layer 260 above the height H1 are removed by the etching process. Remaining material of the anti-reflective material layer lower than the height H1 may then be removed, leaving the adhesive layer 260 as shown in FIG. 22B. In some embodiments, vertical sidewalls of the adhesive layer 260 reach the height H1, which is below upper surfaces of the first dielectric layer 42.

In FIG. 22C, the bridge conductor layer 204 is deposited in a bottom-up process, whereby conductive material, such as a metal, is selectively deposited on the adhesive layer 260, but not on other structures of the IC device 10. In some embodiments, the conductive material is tungsten, cobalt, ruthenium, or other suitable conductive material. In some embodiments, the conductive material is fluorine-free tungsten ("FFW"). In some embodiments, the conductive material of the bridge conductor layer 204 is deposited by a CVD process or other suitable process. Due to the adhesive layer 260 acting as a seed layer for growth of the bridge conductor layer 240, the bridge conductor layer 240 is deposited in a well-controlled manner, and establishes electrical connection between neighboring gate structures of the gate structures 200A-200E not isolated by the inactive fins 94 and the dielectric plugs 99 or by the inactive block 92 and the dielectric plugs 99.

Figure 23A:
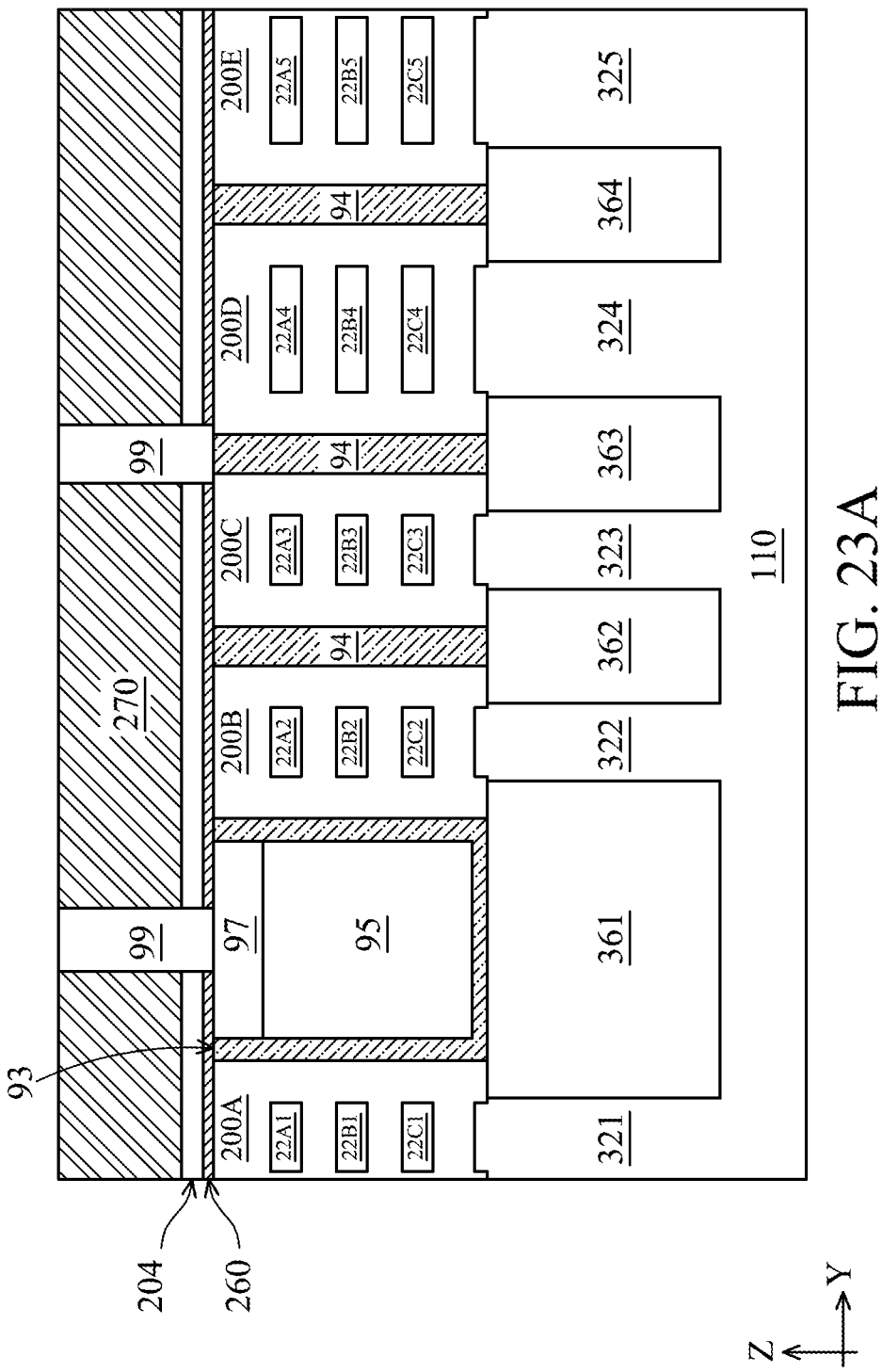

FIG. 23A illustrates the bridge conductor layer 204 on the adhesive layer 260. The bridge conductor layer 204 and the adhesive layer 260 are discontinuous over upper surfaces of the gate structures 200A-200E, the inactive fins 94 and the inactive block 92 due to the presence of the dielectric plugs 99. As such, the gate structure 200B is laterally isolated from the gate structure 200C by the inactive fin 94, and electrically connected to the gate structure 200C by the adhesive layer 260 and the bridge conductor layer 204 overlying and in physical contact with the gate structures 200B, 200C and the inactive fin 94. The gate structures 200D, 200E are electrically connected to each other in a similar fashion to that just described.

Figure 23B:
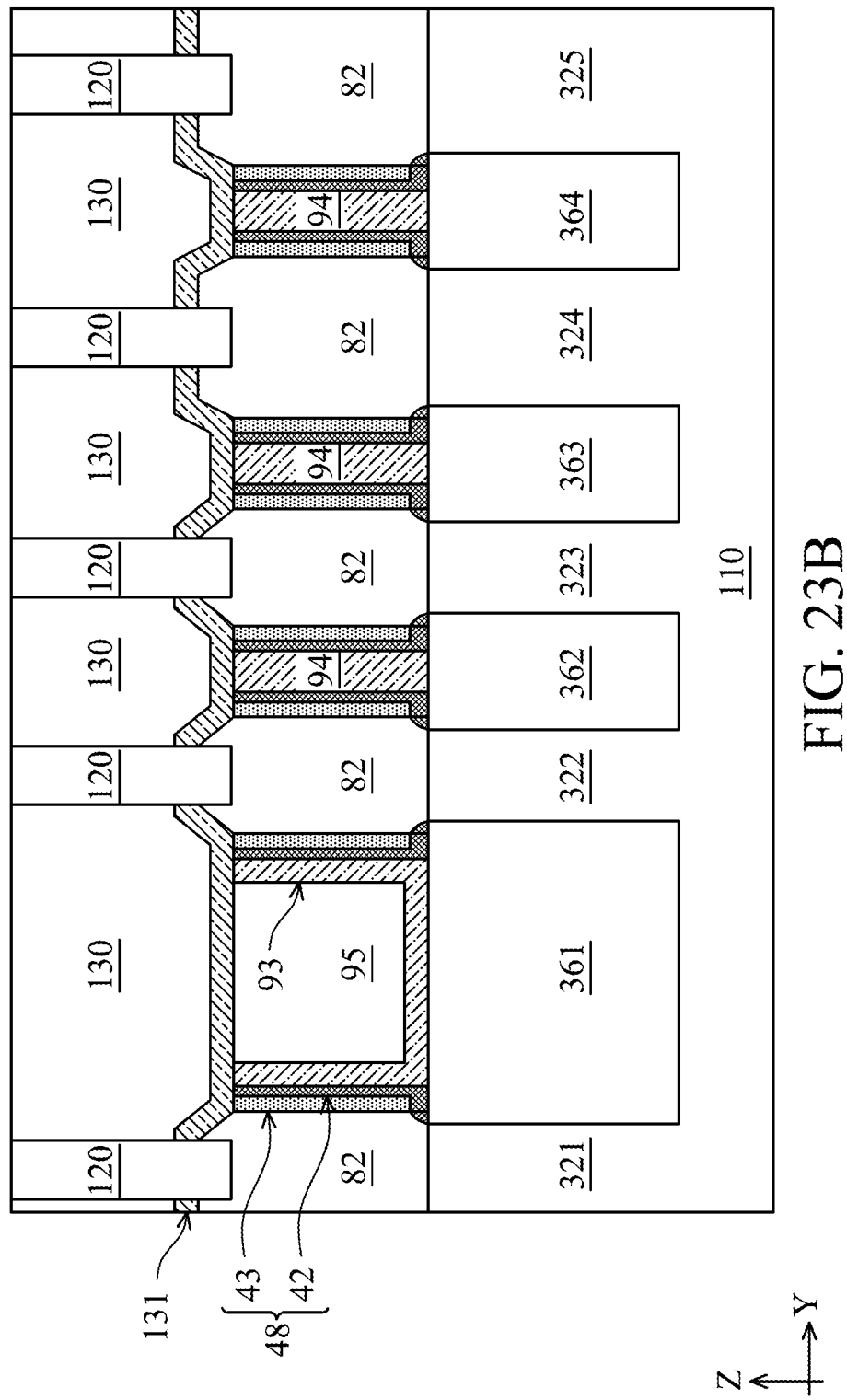
Figure 23C:
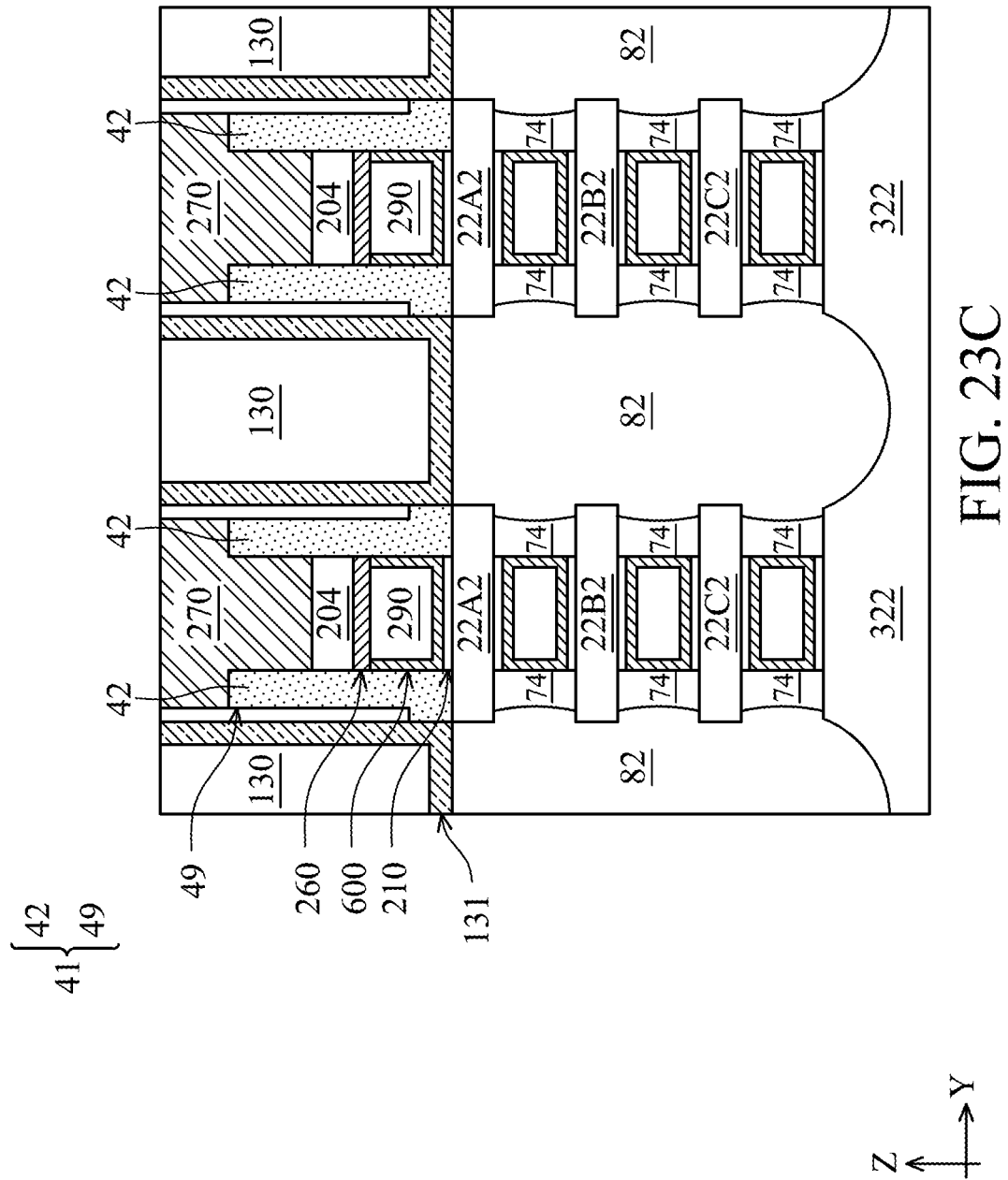

Further in FIG. 23A, and also shown in FIG. 23C, a capping layer 270 is deposited in the opening 250 over the bridge conductor layer 204. In some embodiments, the capping layer 270 is or comprises a dielectric material, such as silicon nitride, silicon oxide, silicon oxynitride, silicon carbide, silicon oxycarbide, silicon oxycarbonitride, or another suitable material. In some embodiments, the dielectric material of the capping layer 270 is deposited by PVD, CVD, ALD, or another suitable process. In some embodiments, the dielectric material of the capping layer 270 is the same as the dielectric material of the dielectric plugs 99. In some embodiments, a visible interface exists between the capping layer 270 and each of the dielectric plugs 99, though the capping layer 270 and the dielectric plugs 99 may present as a continuous material layer without interfaces in some other embodiments. Following formation of the capping layer 270, a removal process, such as CMP, may be performed to planarize and polish upper surfaces of the capping layer 270 and the dielectric plugs 99.

In FIG. 23B, the source/drain contacts 120 are formed through the ILD 130, the etch stop layer 131, and contacting the source/drain features 82. In some embodiments, an etch process is performed to form openings in the ILD 130, then another etch process is performed to extend the openings through the etch stop layer 131 and expose upper surfaces of the source/drain features 82. In some embodiments, a metal silicide layer (not shown for simplicity) is formed at the upper surface of each source/drain feature 82 exposed. The source/drain contacts 120 are then formed by depositing conductive material in the openings over the source/drain features 82. In some embodiments, the conductive material is or includes copper, tungsten, ruthenium, cobalt, or another suitable material. In some embodiments, the conductive material is deposited by PVD, electroless plating, or another suitable process. Following deposition of the conductive material in the openings, a removal process, such as CMP, may be performed to remove excess conductive material on the ILD 130, such that upper surfaces of the source/drain contacts 120 are substantially level with the upper surface of the ILD 130.

FIGS. 24A-28 illustrate another process for forming the IC device 10 of FIG. 1H. Operations illustrated in FIGS. 2-10 are substantially the same for forming the IC devices 10 of FIGS. 1F and 1H.

Figure 24A:
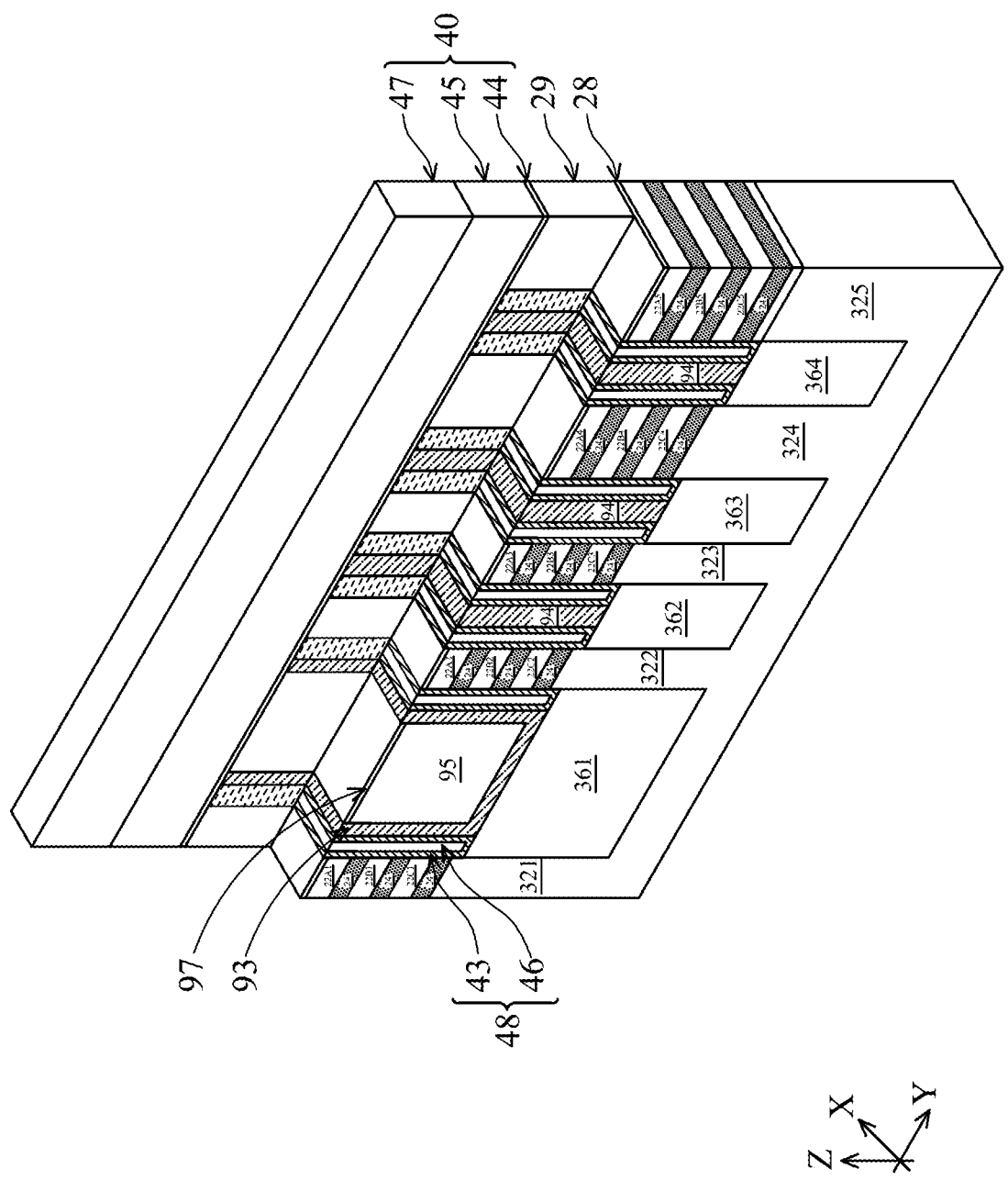
Figure 24C:
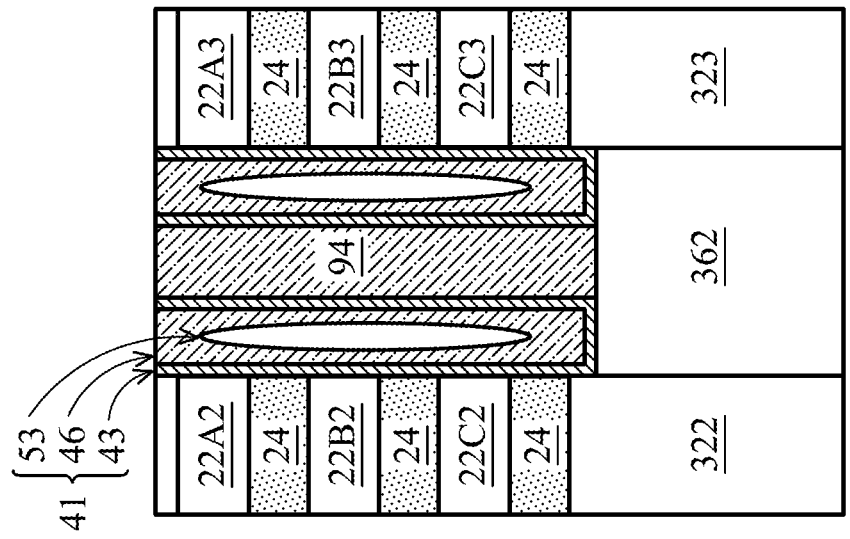
Figure 24B:
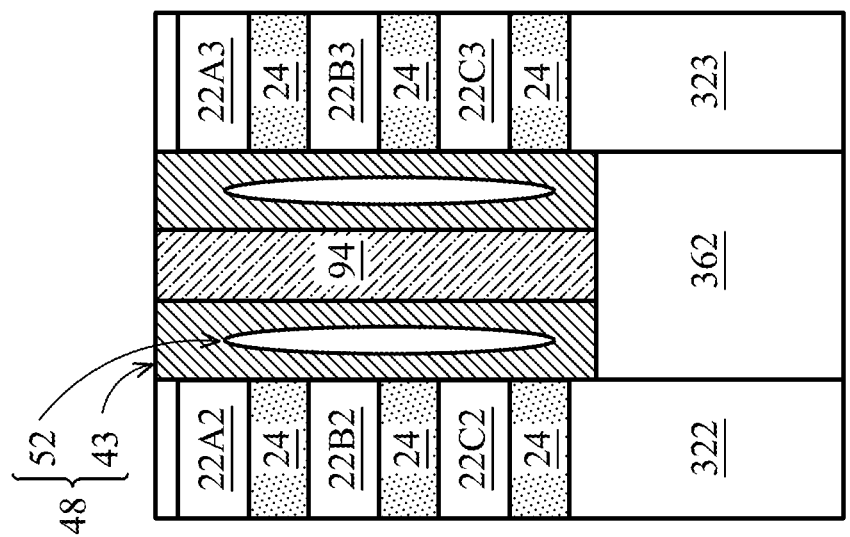

FIGS. 24A-24C illustrate formation of the dielectric isolation features 48, corresponding to operation 1300 of FIG. 29. In FIG. 24A, following formation of the workpiece of FIG. 10, dielectric isolation features 48 are formed in the openings 51 between the nanostructures 22, 24 and the inactive fins 94 and/or the inactive block 92. It is preferable for the dielectric isolation features 48 to provide electrical isolation, structural support, and low RC delay. A liner dielectric layer 43 is deposited conformally in the openings 51. In some embodiments, the liner dielectric layer 43 is or comprises a high-k dielectric material, such as HfO2, ZrO2, HfAlOx, HfSiOx, Al2O3 or another suitable high-k dielectric material, which typically provides more structural support than lower-k dielectric materials. In some embodiments, the liner dielectric layer 43 is deposited by PVD, CVD, ALD, or another suitable process. In some embodiments, the liner dielectric layer 43 is formed to a thickness greater than about 6 angstroms. Thickness below about 6 angstroms may provide insufficient structural support.

Following formation of the liner dielectric layer 43, the fill dielectric layer 46 is formed in the openings 51 between sidewalls and above an upper surface of the liner dielectric layer 43. In some embodiments, the fill dielectric layer 46 is or comprises a low-k dielectric material, such as SiN, SiCN, SiOCN, SiOC or another suitable material. The fill dielectric layer 46 reduces total dielectric constant between the nanostructures 22, 24 and the inactive fins 94 and/or the inactive block 92. In some embodiments, the fill dielectric layer 46 is formed to have a thickness in a range of about 6 angstroms to about 24 nanometers. In some embodiments, the fill dielectric layer 46 is thicker than the liner dielectric layer 43. In some embodiments, a ratio of the thickness of the fill dielectric layer 46 over the thickness of the liner dielectric layer 43 is greater than about 1.5. The ratio being less than about 1.5 may lead to unacceptable parasitic capacitance due to the total dielectric constant of the dielectric isolation features 48 being too high.

FIG. 24A illustrates one configuration for the dielectric isolation feature 48 in accordance with some embodiments. In some alternative embodiments, as shown in FIG. 24B, an air gap 52 may be present in the dielectric isolation feature 48 instead of the fill dielectric layer 46. During deposition of the liner dielectric layer 43, in some embodiments, upper regions of the liner dielectric layer 43 may merge, leaving an air gap 52 (or "void") in the liner dielectric layer 43. The very low dielectric constant of air serves to achieve a reduced total dielectric constant of the dielectric isolation feature 48, while maintaining the structural support provided by the dielectric liner layer 43.

In another alternative configuration shown in FIG. 24C, an air gap 53 is present in the fill dielectric layer 46. Similar to above, during deposition of the fill dielectric layer 46, the air gap 53 is formed when upper regions of the fill dielectric layer 46 merge prior to complete filling of the opening 51.

Figure 25:
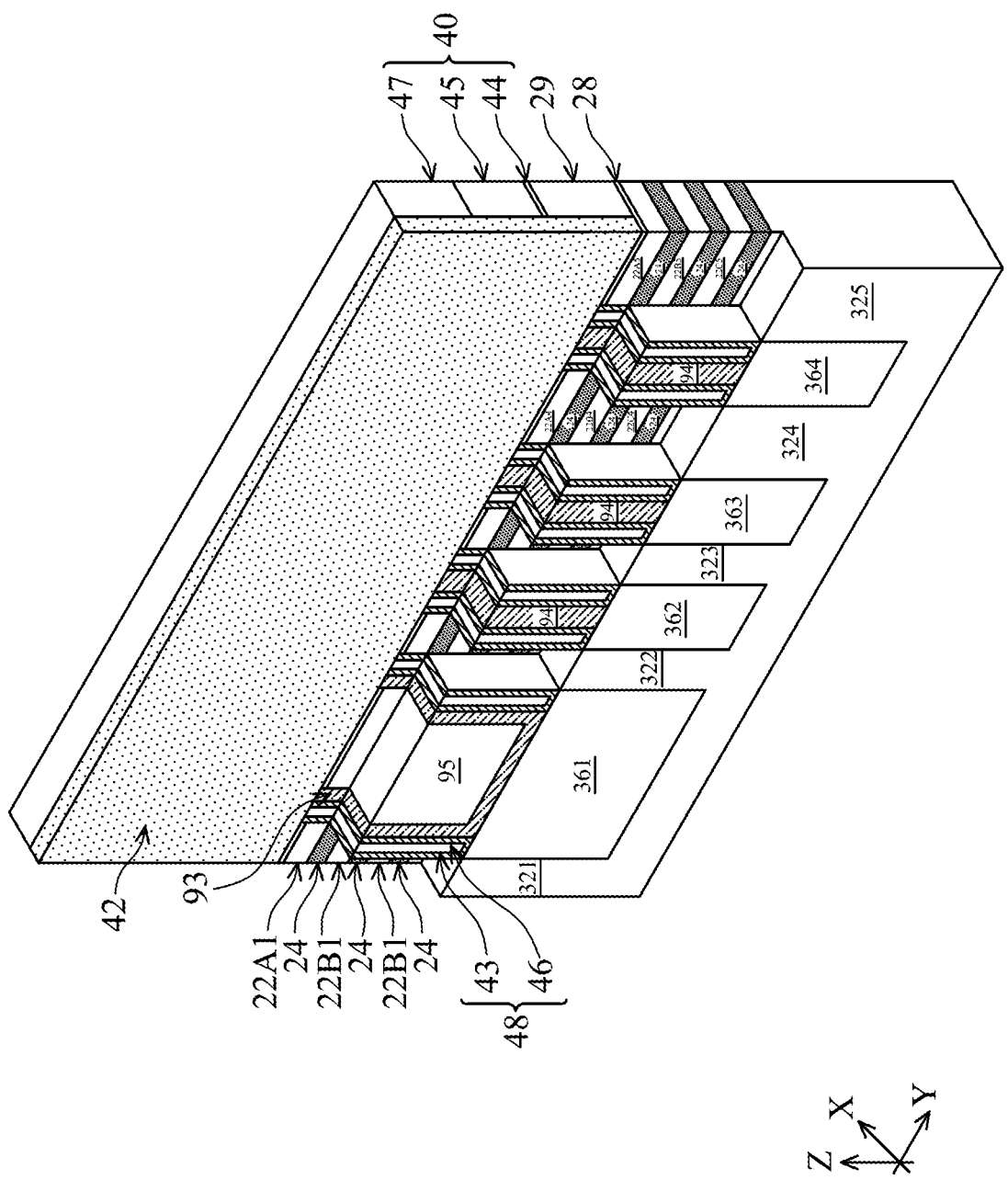

In FIG. 25, similar to FIG. 13, the spacer layer 42 is formed over and on sidewalls of the mask layer 47, the dummy gate layer 45, the gate dielectric layer 44, and the hard mask layer 29. The spacer layer 42 is further formed on the oxide layer 28. In some embodiments, the spacer layer 42 is formed by a conformal deposition process. The spacer layer 42 is made of an insulating material, such as silicon nitride, silicon oxide, silicon carbo-nitride, silicon oxynitride, silicon oxy carbo-nitride, or the like. In some embodiments, the spacer layer 42 comprises polysilicon. In the configuration shown in FIG. 25, different from the configuration shown in FIG. 13, the spacer layer 42 is formed after and separate from the dielectric isolation feature 48. As such, the spacer layer 42 may be formed as a single layer, though the spacer layer 42 in FIG. 25 may also be formed as multiple layers in some embodiments.

Following deposition of the spacer layer 42, horizontal (X-Y plane) surfaces of the spacer layer 42 are removed, then one or more etching processes are performed to etch the portions of protruding fins 321-325 and/or nanostructures 22, 24 that are not covered by dummy gate structures 40, and the spacer layer 42, resulting in the structure shown in FIG. 25. The etching may be anisotropic, such that the portions of fins 321-325 and nanostructures 22, 24 directly underlying dummy gate structures 40 and the spacer layer 42 are protected, and are substantially not etched. The top surfaces of the recessed fins 321-325 may be substantially coplanar with the top surfaces of the isolation regions 361-364, as shown, or slightly below the top surfaces of the isolation regions 361-364, in accordance with some embodiments.

A further etching process or processes may be performed to recess the dielectric isolation features 48, the inactive fins 94, the liner dielectric layer 43, and the inactive block 92. The further etching process may fully remove exposed portions of inactive fin cap 97. The further etching process may also recess exposed portions of the oxide layer 95 and the dielectric liner 93.

Figure 26:
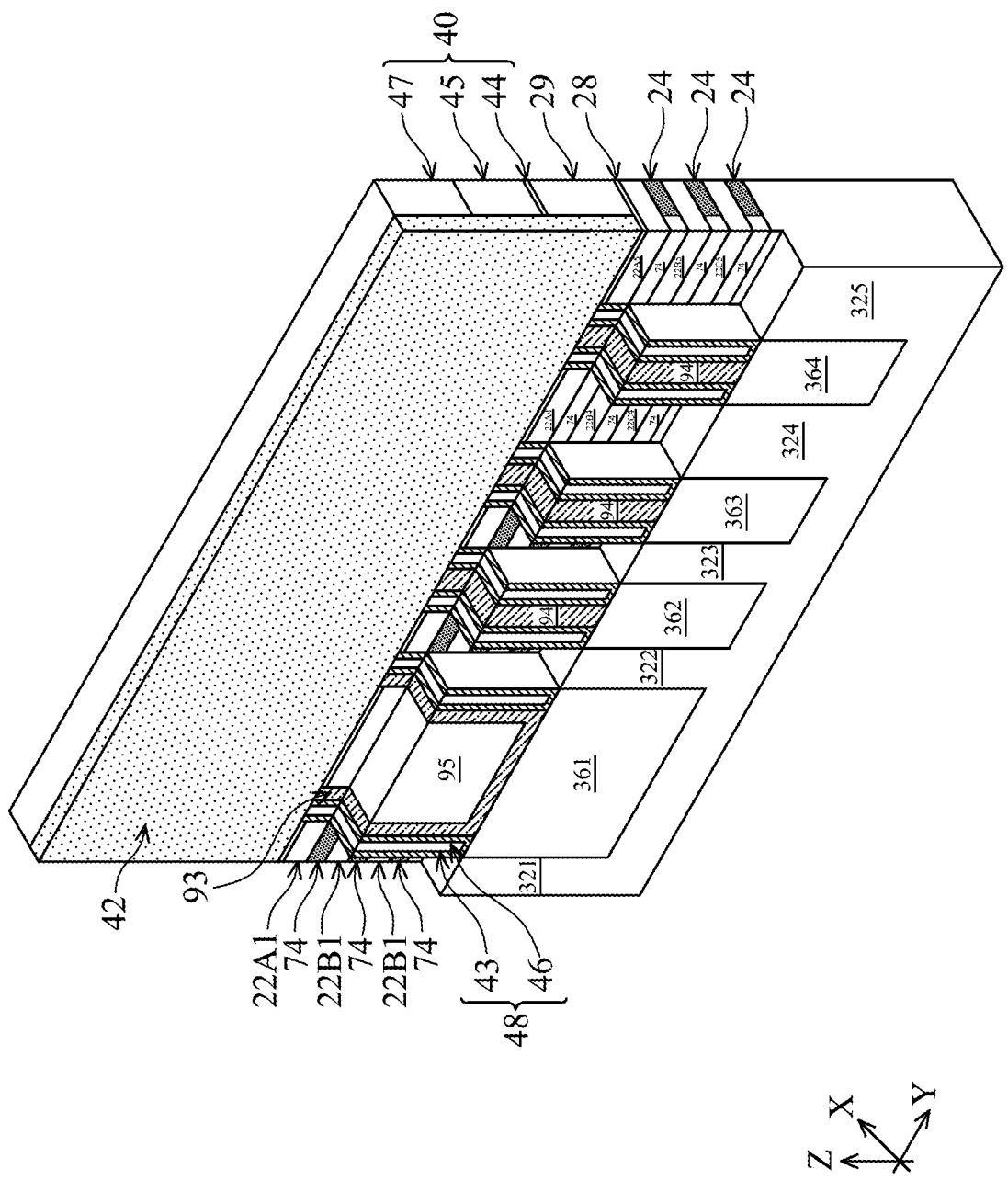

In FIG. 26, similar to FIG. 14, formation of inner spacers 74 is illustrated. A selective etching process is performed to recess exposed end portions of the nanostructures 24 without substantially attacking the nanostructures 22. After the selective etching process, recesses are formed in the nanostructures 24 at locations where the removed end portions used to be. Next, an inner spacer layer is formed to fill the recesses between the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses in the nanostructures 24) form the inner spacers 74. The resulting structure is shown in FIG. 26.

Figure 27:
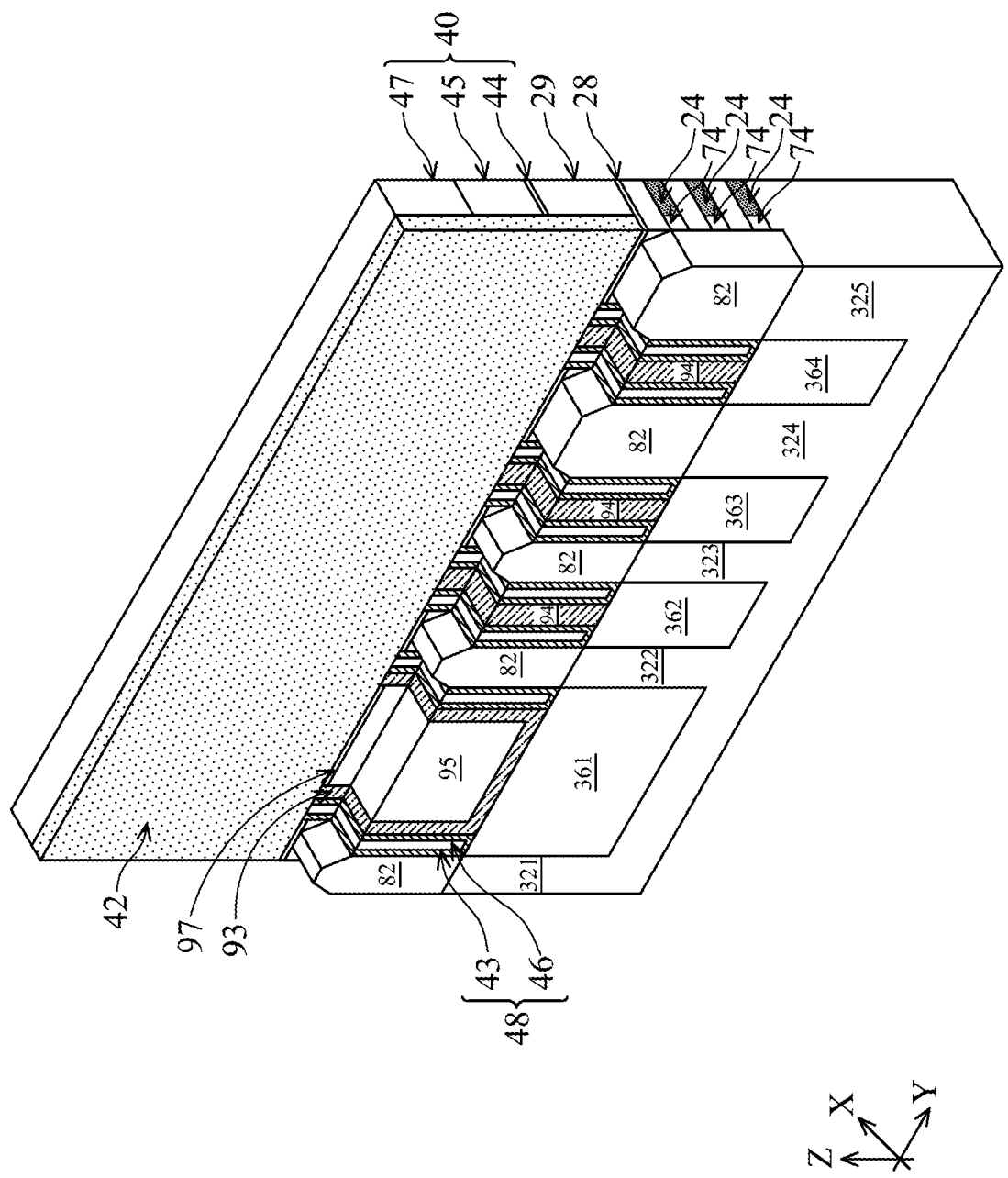

In FIG. 27, similar to FIG. 15, formation of the source/drain regions 82 is illustrated corresponding to operation 1400 of FIG. 29. In the illustrated embodiment, the source/drain regions 82 are epitaxially grown from epitaxial material(s). In some embodiments, due to reduced spacing between the inactive fins 94 including the dielectric isolation features 48, the source/drain regions 82 are grown substantially without lateral growth. In some embodiments, the source/drain regions 82 exert stress in the respective channels 22A1-22C5, thereby improving performance. The source/drain regions 82 are formed such that each dummy gate structure 40 is disposed between respective neighboring pairs of the source/drain regions 82. In some embodiments, the spacer layer 42 and the inner spacers 74 separate the source/drain regions 82 from the dummy gate layer 45 by an appropriate lateral distance to prevent electrical bridging to subsequently formed gates of the resulting device. A contact etch stop layer (CESL) and interlayer dielectric (ILD), not illustrated for simplicity, may then be formed covering the dummy gate structures 40 and the source/drain regions 82.

Following formation of the source/drain regions 82, operations illustrated in FIGS. 16-22C are performed to release the nanostructures 22 (operation 1500), form the gate structures 200A-200E around and above the nanostructures 22 (operation 1600), form the dielectric plugs 99 over the inactive fins 94 and/or inactive block 92 (operation 1700), and electrically connect neighboring gate structures of the gate structures 200A-200E by the bridge conductor layer 204 over the gate structures 200A-200E and between the dielectric plugs 99 (operation 1800).

In FIG. 28, the source/drain contacts 120 are formed through the ILD 130, the etch stop layer 131, and contacting the source/drain features 82. In some embodiments, an etch process is performed to form openings in the ILD 130, then another etch process is performed to extend the openings through the etch stop layer 131 and expose upper surfaces of the source/drain features 82. In some embodiments, a metal silicide layer (not shown for simplicity) is formed at the upper surface of each source/drain feature 82 exposed. The source/drain contacts 120 are then formed by depositing conductive material in the openings over the source/drain features 82. In some embodiments, the conductive material is or includes copper, tungsten, ruthenium, cobalt, or another suitable material. In some embodiments, the conductive material is deposited by PVD, electroless plating, or another suitable process. Following deposition of the conductive material in the openings, a removal process, such as CMP, may be performed to remove excess conductive material on the ILD 130, such that upper surfaces of the source/drain contacts 120 are substantially level with the upper surface of the ILD 130.

Additional processing may be performed to finish fabrication of the GAA devices 20A-20E. For example, gate contacts (not illustrated for simplicity) may be formed to electrically couple to the gate structures 200A-200F. An interconnect structure may then be formed over the source/drain contacts 120 and the gate contacts. The interconnect structure may include a plurality of dielectric layers surrounding metallic features, including conductive traces and conductive vias, which form electrical connection between devices on the substrate 110, such as the GAA devices 20A-20E, as well as to IC devices external to the IC device 10.

Embodiments may provide advantages. By forming the inactive fins 94 and the inactive block 92 by a self-aligned process prior to forming the gate structures 200A-200E, spacing between the gate structures 200A-200E can be scaled down beyond what was previously possible. Further, by shrinking width of the source/drain regions 82 by use of the dielectric isolation features 48, cell capacitance may be reduced by as much as 5%.

In accordance with at least one embodiment, a device comprises a substrate; a first semiconductor channel over the substrate; a second semiconductor channel over the substrate and laterally offset from the first semiconductor channel; a third semiconductor channel over the substrate and laterally offset from the second semiconductor channel; a first gate structure over and laterally surrounding the first semiconductor channel; a second gate structure over and laterally surrounding the second semiconductor channel; a third gate structure over and laterally surrounding the third semiconductor channel; a first inactive fin between the first gate structure and the second gate structure; a second inactive fin between the second gate structure and the third gate structure; a bridge conductor layer over the first, second, and third gate structures, and the first and second inactive fins; and a dielectric plug extending from an upper surface of the second inactive fin, through the bridge conductor layer, to at least an upper surface of the bridge conductor layer.

In accordance with at least one embodiment, a device comprises a substrate; a first transistor on the substrate, having a first gate structure extending in a first direction; a second transistor on the substrate, having a second gate structure aligned with the first gate structure and extending in the first direction, the second gate structure electrically isolated from the first gate structure; an isolation region in the substrate and between the first transistor and the second transistor in the first direction; and a gate isolation structure in contact with the first gate structure, the second gate structure, and the isolation region. The gate isolation structure comprises a first portion extending from an upper surface of the isolation region to an upper surface of the first gate structure and an upper surface of the second gate structure; and a second portion extending from the upper surface of the first portion to a height above the upper surfaces of the first and second gate structures.

In accordance with at least one embodiment, a method comprises: forming a first fin stack and a second fin stack; forming an inactive fin in a first opening between the first fin stack and the second fin stack by a self-aligned process; forming a first gate structure over the first fin stack, and a second gate structure over the second fin stack, wherein the first gate structure is isolated from the second gate structure by the inactive fin; forming a dielectric plug over the inactive fin after forming the first and second gate structures; and forming a bridge conductor layer on the first and second gate structures, wherein a bridge conductor layer extends to a vertical height that is below an upper surface of the dielectric plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
a first semiconductor channel over the substrate;
a second semiconductor channel over the substrate and laterally offset from the first semiconductor channel;
a third semiconductor channel over the substrate and laterally offset from the second semiconductor channel;
a first gate structure over and laterally surrounding the first semiconductor channel;
a second gate structure over and laterally surrounding the second semiconductor channel;
a third gate structure over and laterally surrounding the third semiconductor channel;
a first inactive fin between the first gate structure and the second gate structure;
a second inactive fin between the second gate structure and the third gate structure;
a bridge conductor layer over the first, second, and third gate structures, and the first and second inactive fins; and
a dielectric plug extending from an upper surface of the second inactive fin, through the bridge conductor layer, to at least an upper surface of the bridge conductor layer.

2. The device of claim 1, further comprising:
a first dielectric isolation feature on a first sidewall of the first inactive fin;
a second dielectric isolation feature on a second sidewall of the second inactive fin, the second sidewall facing the first sidewall; and
a source/drain feature extending from the first sidewall to the second sidewall.

3. The device of claim 2, wherein the first dielectric isolation feature comprises:
a first dielectric layer having a first dielectric constant; and
a liner layer between the first dielectric layer and the first sidewall.

4. The device of claim 3, wherein the liner layer is the same layer as, and continuous with, a gate spacer layer of the third gate structure.

5. The device of claim 4, wherein the liner layer comprises polysilicon.

6. The device of claim 3, wherein the liner layer comprises a dielectric material having a second dielectric constant lower than the first dielectric constant.

7. The device of claim 2, wherein the first dielectric isolation feature comprises:
a liner layer on the first sidewall, an upper surface of an isolation structure, and a third sidewall of the source/drain feature; and
a second dielectric layer laterally between vertical portions of the liner layer.

8. The device of claim 7, wherein:
the liner layer has a first dielectric constant; and
the second dielectric layer has a second dielectric constant less than the first dielectric constant.

9. The device of claim 2, wherein the first dielectric isolation feature comprises:
a liner layer on the first sidewall, an upper surface of an isolation structure, and a third sidewall of the source/drain feature, the liner layer having a dielectric constant greater than about 3.9; and
air enclosed by the liner layer.

10. A device comprising:
a substrate;
a first transistor on the substrate, having a first gate structure extending in a first direction;
a second transistor on the substrate, having a second gate structure aligned with the first gate structure and extending in the first direction, the second gate structure electrically isolated from the first gate structure;
an isolation region in the substrate and between the first transistor and the second transistor in the first direction;
a gate isolation structure in contact with the first gate structure, the second gate structure, and the isolation region, the gate isolation structure comprising:
a first portion extending from an upper surface of the isolation region to an upper surface of the first gate structure and an upper surface of the second gate structure; and
a second portion extending from the upper surface of the first portion to a height above the upper surfaces of the first and second gate structures,
an adhesive layer on the first gate structure and the second gate structure, wherein the adhesive layer comprises a metal nitride; and
a conductive layer on the adhesive layer, wherein the conductive layer comprises fluorine-free tungsten.

11. The device of claim 10, wherein the conductive layer is formed using the adhesive layer as a seed layer in a selective deposition process.

12. The device of claim 10, further comprising:
a third transistor having a third gate structure aligned with the first gate structure and extending in the first direction, the third gate structure electrically isolated from the first gate structure;
an inactive block between the first transistor and the third transistor; and
a second dielectric plug extending from an upper surface of the inactive block, through the adhesive layer and the conductive layer, to at least an upper surface of the conductive layer.

13. The device of claim 10, further comprising: and
a dielectric capping layer overlying the first and second gate structures;
wherein the second portion extends through the dielectric capping layer, and an upper surface of the second portion is substantially coplanar with an upper surface of the dielectric capping layer.

14. A method, comprising:
forming a first fin stack and a second fin stack;
forming an inactive fin in a first opening between the first fin stack and the second fin stack by a self-aligned process;
forming a first gate structure over the first fin stack, and a second gate structure over the second fin stack, wherein the first gate structure is isolated from the second gate structure by the inactive fin;
forming a dielectric plug over the inactive fin after forming the first and second gate structures; and
forming a bridge conductor layer on the first and second gate structures, wherein the bridge conductor layer extends to a vertical height that is below an upper surface of the dielectric plug.

15. The method of claim 14, further comprising:
forming a dielectric isolation feature between the inactive fin and the first fin stack;
forming a second opening by recessing a portion of the first fin stack laterally between the dielectric isolation feature and a neighboring dielectric feature; and
forming a source/drain region in the second opening, in contact with the dielectric isolation feature, and in contact with the first fin stack.

16. The method of claim 15, wherein forming the dielectric isolation feature comprises:
forming a liner layer on surfaces of the first fin stack, the second fin stack, and the inactive fin; and
forming a first dielectric layer having a first dielectric constant on the liner layer, and laterally between the first fin stack and the inactive fin and the second fin stack and the inactive fin.

17. The method of claim 16, wherein the liner layer is further formed on a sidewall of a dummy gate structure overlying the first fin stack and the second fin stack.

18. The method of claim 16, wherein the liner layer has a first dielectric constant higher than a second dielectric constant of the first dielectric layer.

19. The method of claim 14, further comprising:
forming an adhesive layer on the first gate structure and the second gate structure extending to substantially the vertical height;
wherein the bridge conductor layer is formed using the adhesive layer as a seed layer in a selective deposition process.

20. The method of claim 14, further comprising:
electrically connecting the first gate structure to a third gate structure by the bridge conductor layer.

* * * * *